(12) United States Patent
Park et al.

(10) Patent No.: US 10,403,834 B2
(45) Date of Patent: Sep. 3, 2019

(54) FLEXIBLE DISPLAY DEVICE, METHOD FOR FABRICATING WINDOW MEMBER OF SAME, AND HARD COATING COMPOSITION

(71) Applicant: Samsung Display Co., Ltd., Yongin-si, Gyeonggi-do (KR)

(72) Inventors: Youngsang Park, Seoul (KR); Chulho Jeong, Seoul (KR); Ahyoung Kim, Gunpo-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 81 days.

(21) Appl. No.: 15/263,265

(22) Filed: Sep. 12, 2016

(65) Prior Publication Data
US 2017/0244052 A1    Aug. 24, 2017

(30) Foreign Application Priority Data
Feb. 19, 2016    (KR) .................... 10-2016-0019687

(51) Int. Cl.
*H01L 51/00*        (2006.01)
*H01L 51/52*        (2006.01)
(Continued)

(52) U.S. Cl.
CPC .......... *H01L 51/0097* (2013.01); *C08G 59/24* (2013.01); *C08G 65/22* (2013.01);
(Continued)

(58) Field of Classification Search
CPC ......... C09D 183/06; G06F 3/41; G06F 3/041; H01L 51/0034; H01L 51/5256;
(Continued)

(56) References Cited

U.S. PATENT DOCUMENTS 5,118,528 A * 6/1992 Fessi .................... A61K 9/5138
264/4.1
6,165,619 A * 12/2000 Ikenaga ................. B05D 7/546
427/387
(Continued)

FOREIGN PATENT DOCUMENTS

JP    2009-024168 A    2/2009
JP    2012-011766 A    1/2012
(Continued)

OTHER PUBLICATIONS

EPO Extended Search Report dated Jul. 10, 2017, for corresponding European Patent Application No. 16200974.0 (6 pages).

*Primary Examiner* — Caridad Everhart
(74) *Attorney, Agent, or Firm* — Lewis Roca Rothgerber Christie LLP

(57) ABSTRACT

A flexible display device including a hard coating layer, the hard coating layer containing first hard coating oligomers, second hard coating oligomers having greater molecular weights than the first hard coating oligomers, a cross-linker, and a photoinitiator. The first hard coating oligomers may maintain the hardness of the hard coating layer and the second hard coating oligomers may improve the flexibility of the hard coating layer, such that damage to the hard coating layer may be prevented or reduced even when the flexible display device is bent.

23 Claims, 13 Drawing Sheets

(51) Int. Cl.
| | |
|---|---|
| H01L 27/32 | (2006.01) |
| C09D 183/06 | (2006.01) |
| H05K 1/02 | (2006.01) |
| H05K 5/00 | (2006.01) |
| C08J 7/04 | (2006.01) |
| C08J 7/18 | (2006.01) |
| C09D 163/00 | (2006.01) |
| C09D 183/00 | (2006.01) |
| C08G 77/18 | (2006.01) |
| C08G 59/24 | (2006.01) |
| C08G 65/22 | (2006.01) |
| G06F 3/041 | (2006.01) |
| G09G 3/3233 | (2016.01) |

(52) U.S. Cl.
CPC .............. *C08G 77/18* (2013.01); *C08J 7/047* (2013.01); *C08J 7/18* (2013.01); *C09D 163/00* (2013.01); *C09D 183/00* (2013.01); *C09D 183/06* (2013.01); *H01L 27/323* (2013.01); *H01L 27/3211* (2013.01); *H01L 27/3246* (2013.01); *H01L 27/3248* (2013.01); *H01L 27/3262* (2013.01); *H01L 27/3265* (2013.01); *H01L 27/3276* (2013.01); *H01L 51/5256* (2013.01); *H05K 1/028* (2013.01); *H05K 5/0017* (2013.01); *C08J 2383/06* (2013.01); *G06F 3/041* (2013.01); *G06F 2203/04102* (2013.01); *G09G 3/3233* (2013.01); *H01L 2251/5338* (2013.01)

(58) Field of Classification Search
CPC .............. H01L 51/5253; H01L 27/3244; H01L 2251/5338; H05K 1/028
See application file for complete search history.

(56) References Cited

U.S. PATENT DOCUMENTS

| | | | | |
|---|---|---|---|---|
| 6,867,242 | B1* | 3/2005 | Frances | C08K 5/0025 427/503 |
| 2006/0263607 | A1* | 11/2006 | Izumi | C09D 175/16 428/412 |
| 2008/0051517 | A1* | 2/2008 | Okai | C08L 33/08 525/227 |
| 2010/0105798 | A1* | 4/2010 | Hasegawa | C08F 299/00 522/99 |
| 2010/0179283 | A1* | 7/2010 | Sueyoshi | C08G 77/50 524/858 |
| 2010/0209687 | A1* | 8/2010 | Zhu | B82Y 30/00 428/220 |
| 2011/0217544 | A1* | 9/2011 | Young | B29C 37/0032 428/327 |
| 2012/0088861 | A1* | 4/2012 | Huang | C08G 77/42 523/107 |
| 2012/0141936 | A1* | 6/2012 | Wu | G03F 7/0233 430/270.1 |
| 2013/0083496 | A1 | 4/2013 | Franklin et al. | |
| 2014/0057115 | A1* | 2/2014 | Treadway | C09D 171/00 428/412 |
| 2014/0065326 | A1 | 3/2014 | Lee et al. | |
| 2015/0159044 | A1 | 6/2015 | Bae et al. | |
| 2015/0203724 | A1* | 7/2015 | Kondos | C08G 18/61 524/506 |
| 2016/0024348 | A1 | 1/2016 | Kim et al. | |
| 2016/0297933 | A1* | 10/2016 | Kuwana | C09D 183/06 |
| 2016/0324730 | A1* | 11/2016 | Lee | A61K 6/0835 |
| 2017/0166528 | A1* | 6/2017 | Peters | C07D 209/34 |

FOREIGN PATENT DOCUMENTS

| | | |
|---|---|---|
| KR | 10-0884079 B1 | 2/2009 |
| KR | 10-2011-0057556 A | 6/2011 |
| KR | 10-1098529 B1 | 12/2011 |
| KR | 10-1168073 B1 | 7/2012 |
| KR | 10-1402105 B1 | 6/2014 |
| KR | 10-2015-0000745 A | 1/2015 |
| KR | 10-2015-0086426 A | 7/2015 |
| KR | 10-2015-0088101 A | 7/2015 |
| KR | 10-1622001 B1 | 5/2016 |
| KR | 10-2016-0120840 | 10/2016 |
| WO | WO 2013/059286 A1 | 4/2013 |
| WO | WO 2016/146896 A1 | 9/2016 |

* cited by examiner

FLEXIBLE DISPLAY DEVICE, METHOD FOR FABRICATING WINDOW MEMBER OF SAME, AND HARD COATING COMPOSITION

CROSS-REFERENCE TO RELATED APPLICATION

This application claims priority to and the benefit of Korean Patent Application No. 10-2016-0019687, filed on Feb. 19, 2016, the entire content of which is incorporated herein by reference.

BACKGROUND

One or more aspects of example embodiments of the present disclosure are related to a flexible display device, and to a flexible display device having a hard coating layer.

Electronic devices such as smartphones, digital cameras, notebook computers, navigation systems, and smart televisions are being developed. Such electronic devices may be equipped with display devices for providing information.

As electronic devices evolve into various forms, display devices are also changing. In the past, electronic devices have been equipped with flat display devices. Recently developed electronic devices require flexible display devices (such as curved, bendable, and rollable displays).

In addition, consumers demand thin electronic devices. In order to achieve such thin electronic devices, various functional members (e.g., various functional parts) are being integrated into display devices.

SUMMARY

One or more aspects of example embodiments of the present disclosure are directed toward a flexible display device that has improved hardness and flexibility.

Moreover, an aspect of example embodiments of the present disclosure is directed toward a window member that has improved hardness and flexibility.

Furthermore, an aspect of example embodiments of the present disclosure is directed toward a hard coating composition.

One or more example embodiments of the present disclosure provide a flexible display device including a flexible display panel; and a window member on the flexible display panel. The window member includes a flexible base member and a hard coating layer on the flexible base member. The hard coating layer may contain a photoinitiator and a polymer represented by Formula 1:

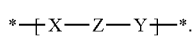

Formula 1

In Formula 1, X may be represented by Formula 2:

Formula 2

In Formula 2, n may be an integer selected from 8 to 30; $R_1$ may be a hydroxy group, a substituted or unsubstituted aryl group having 6 to 30 carbon atoms for forming a ring, an alkoxy group, a substituted or unsubstituted alkyl group having 1 to 20 carbon atoms, or a photoinitiated reactive group; at least one of the plurality of $R_1(s)$ may be a photoinitiated reactive group; and $R_2$ may be a hydroxy group, a substituted or unsubstituted aryl group having 6 to 30 carbon atoms for forming a ring, an alkoxy group, a substituted or unsubstituted alkyl group having 1 to 20 carbon atoms, or a photoinitiated reactive group.

In Formula 1, Y may be represented by Formula 3:

Formula 3

In Formula 3, m may be an integer selected from 46 to 150; $R_3$ may be a hydroxy group, a substituted or unsubstituted aryl group having 6 to 30 carbon atoms for forming a ring, an alkoxy group, a substituted or unsubstituted alkyl group having 1 to 20 carbon atoms, or a photoinitiated reactive group; at least one of the plurality of $R_3(s)$ may be a photoinitiated reactive group; and $R_4$ may be a hydroxy group, a substituted or unsubstituted aryl group having 6 to 30 carbon atoms for forming a ring, an alkoxy group, a substituted or unsubstituted alkyl group having 1 to 20 carbon atoms, or a photoinitiated reactive group.

In Formula 1, Z may be a cross-linker (e.g., a cross-linking group).

In one or more embodiments, the photoinitiated reactive group may be an ester group substituted with an epoxy group or an alkenyl group, an alkyl group having 1 to 20 carbon atoms and a substituent including an epoxy group or an alkenyl group, or a substituted or unsubstituted alkenyl group having 1 to 20 carbon atoms.

In one or more embodiments, the photoinitiated reactive group may be represented by Formula 4 or Formula 5:

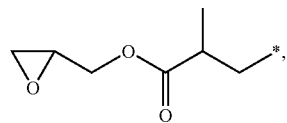

Formula 4

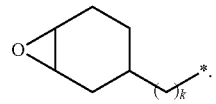

Formula 5

In Formula 5, k may be an integer selected from 1 to 10.

In one embodiment, the cross-linker may include an alicyclic diepoxy carboxylate.

In one embodiment, the cross-linker may be 4-vinylcyclohexene dioxide, cyclohexene vinyl monoxide, (3,4-epoxycyclohexyl)methyl 3,4-epoxycyclohexylcarboxylate, 3,4-epoxycyclohexylmethyl methacrylate, bis(3,4-epoxycyclohexylmethyl)adipate, 3,4-epoxycyclohexanecarboxylate, or 2-(3,4-epoxycyclohexyl)-1,3-dioxolane.

In one or more embodiments, Z may be represented by Formula 6:

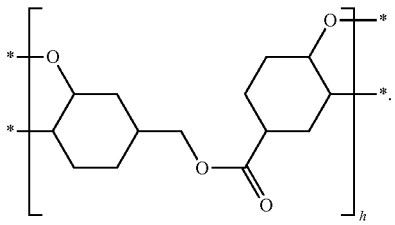

Formula 6

In Formula 6, h may be an integer selected from 1 to 7.

In one or more embodiments, the photoinitiator may include a first photoinitiator and a second photoinitiator initiated by light of different wavelengths from each other (e.g., the first photoinitiator may be initiated by light having a first wavelength and the second photoinitiator may be initiated by light having a second wavelength different from the first wavelength).

In one or more embodiments, the hard coating layer may further include at least one of a polymer represented by Formula 1A or a polymer represented by Formula 1B:

Formula 1A

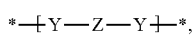

Formula 1B wherein in Formulae 1A and 1B, X, Y, and Z may each independently be the same as described herein in connection with Formula 1.

In one or more embodiments of the present disclosure, a method for preparing a window member includes preparing a hard coating composition including a solvent and a hard coating solid matter that contains photoinitiators, first oligomers, second oligomers, and cross-linkers; applying the hard coating composition on a flexible base member to form a preliminary hard coating layer; drying the preliminary hard coating layer to remove the solvent; and photo-curing the dried preliminary hard coating layer. The molecular weight of the first oligomers may be 2,000 to 6,000, and the molecular weight of the second oligomers may be 10,000 to 30,000.

In one embodiment, each of the first oligomers may be represented by Formula 2:

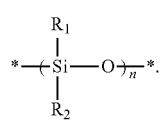

Formula 2

In Formula 2, n may be an integer selected from 8 to 30; $R_1$ may be a hydroxy group, a substituted or unsubstituted aryl group having 6 to 30 carbon atoms for forming a ring, an alkoxy group, a substituted or unsubstituted alkyl group having 1 to 20 carbon atoms, or a photoinitiated reactive group; at least one of the plurality of $R_1$(s) may be a photoinitiated reactive group; and $R_2$ may be a hydroxy group, a substituted or unsubstituted aryl group having 6 to 30 carbon atoms for forming a ring, an alkoxy group, a substituted or unsubstituted alkyl group having 1 to 20 carbon atoms, or a photoinitiated reactive group.

Each of the second oligomers may be represented by Formula 3:

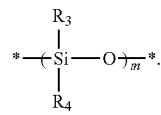

Formula 3

In Formula 3, m may be an integer selected from 46 to 150; $R_3$ may be a hydroxy group, a substituted or unsubstituted aryl group having 6 to 30 carbon atoms for forming a ring, an alkoxy group, a substituted or unsubstituted alkyl group having 1 to 20 carbon atoms, or a photoinitiated reactive group; at least one selected from the plurality of $R_3$(s) may be a photoinitiated reactive group; and $R_4$ may be a hydroxy group, a substituted or unsubstituted aryl group having 6 to 30 carbon atoms for forming a ring, an alkoxy group, a substituted or unsubstituted alkyl group having 1 to 20 carbon atoms, or a photoinitiated reactive group.

In one embodiment, the hard coating solid matter may contain 6 wt % to 36 wt % of the first oligomers, 36 wt % to 70 wt % of the second oligomers, 10 wt % to 20 wt % of the cross-linkers, and 1 wt % to 4 wt % of the photoinitiators (with respect to 100 wt % of the hard coating solid matter).

In one embodiment, the photoinitiated reactive group may be represented by
Formula 4 or Formula 5:

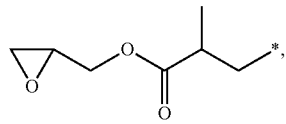

Formula 4

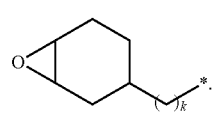

Formula 5

In Formula 5, k may be an integer selected from 1 to 10.

In one embodiment, each of the cross-linkers may include a monomer represented by Formula 6B:

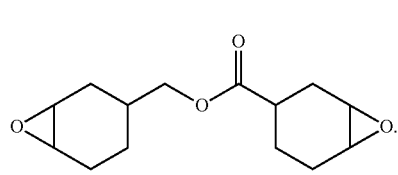

Formula 6B

In one embodiment, the hard coating composition may further include silicon nanoparticles.

In one embodiment, the hard coating composition may further include bisphenol-A-epoxy-silicone block copolymers.

In one embodiment, the photoinitiator may include a first photoinitiator and a second photoinitiator initiated by light having different wavelength ranges from each other (e.g., the first photoinitiator may be initiated by light having a first wavelength and the second photoinitiator may be initiated by light having a second wavelength different from the first wavelength).

In one embodiment, the photo-curing of the dried preliminary hard coating layer may include emitting light having a first wavelength range on the dried preliminary hard coating layer, the light having the first wavelength range initiating the first photoinitiator; and emitting light having a second wavelength range on the dried preliminary hard coating layer, the light having the second wavelength range initiating the second photoinitiator.

In one embodiment of the present disclosure, a hard coating composition may include a solvent and a hard coating solid matter. The hard coating solid matter may contain 6 wt % to 36 wt % of first oligomers, 36 wt % to 70 wt % of second oligomers, 10 wt % to 20 wt % of cross-linkers, and 1 wt % to 4 wt % of photoinitiators (with respect to 100 wt % of the hard coating solid matter). The molecular weight of the first oligomers may be 2,000 to 6,000, and the molecular weight of the second oligomers may be 10,000 to 30,000.

In one embodiment, each of the first oligomers may be represented by Formula 2:

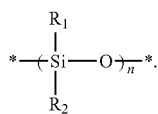

Formula 2

In Formula 2, n may be an integer selected from 8 to 30; $R_1$ may be a hydroxy group, a substituted or unsubstituted aryl group having 6 to 30 carbon atoms for forming a ring, an alkoxy group, a substituted or unsubstituted alkyl group having 1 to 20 carbon atoms, or a photoinitiated reactive group; at least one of the plurality of $R_1$(s) may be a photoinitiated reactive group; and $R_2$ may be a hydroxy group, a substituted or unsubstituted aryl group having 6 to 30 carbon atoms for forming a ring, an alkoxy group, a substituted or unsubstituted alkyl group having 1 to 20 carbon atoms, or a photoinitiated reactive group.

Each of the second oligomers may be represented by Formula 3:

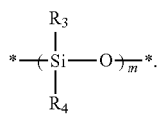

Formula 3

In Formula 3, m may be an integer selected from 46 to 150; $R_3$ may be a hydroxy group, a substituted or unsubstituted aryl group having 6 to 30 carbon atoms for forming a ring, an alkoxy group, a substituted or unsubstituted alkyl group having 1 to 20 carbon atoms, or a photoinitiated reactive group; at least one of the plurality of $R_3$(s) may be a photoinitiated reactive group; and $R_4$ may be a hydroxy group, a substituted or unsubstituted aryl group having 6 to 30 carbon atoms for forming a ring, an alkoxy group, a substituted or unsubstituted alkyl group having 1 to 20 carbon atoms, or a photoinitiated reactive group.

In one embodiment, the photoinitiated reactive group may be represented by Formula 4 or Formula 5:

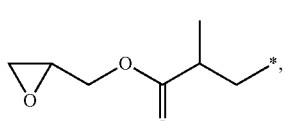

Formula 4

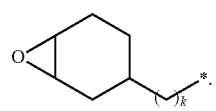

Formula 5

In Formula 5, k may be an integer selected from 1 to 10.

In one or more embodiments, each of the cross-linkers may include a monomer represented by Formula 6B:

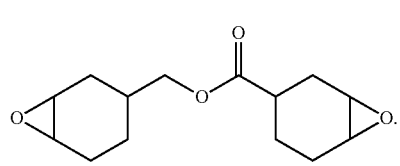

Formula 6B

In one embodiment, the cross-linkers may be 4-vinylcyclohexene dioxide, cyclohexene vinyl monoxide, (3,4-epoxycyclohexyl)methyl 3,4-epoxycyclohexylcarboxylate, 3,4-epoxycyclohexylmethyl methacrylate, bis(3,4-epoxycyclohexylmethyl)adipate, 3,4-epoxycyclohexanecarboxylate, or 2-(3,4-epoxycyclohexyl)-1,3-dioxolane.

In one embodiment, the hard coating composition may further include silicon nanoparticles.

In one embodiment, the hard coating composition may further include a bisphenol-A-epoxy-silicone block copolymer.

In one or more embodiments, the photoinitiator may include a first photoinitiator and a second photoinitiator initiated by light having different wavelength ranges from each other (e.g., the first photoinitiator may be initiated by light having a first wavelength and the second photoinitiator may be initiated by light having a second wavelength different from the first wavelength).

DETAILED DESCRIPTION

Figure 1A:
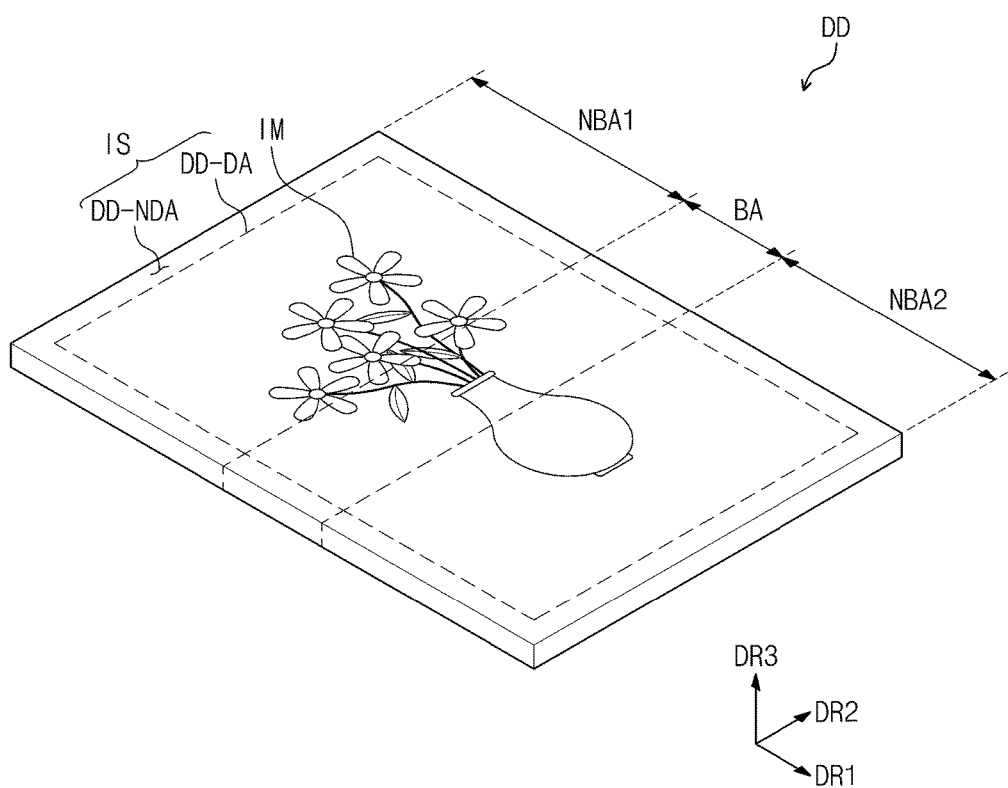
FIG. 1A is a perspective view illustrating a first operation of a flexible display device according to an embodiment of the present disclosure.

Hereinafter, embodiments of the present disclosure will be described in more detail with reference to the accompanying drawings. The drawings illustrate example embodiments of the present disclosure and, together with the description, serve to explain principles of the present disclosure. It will be understood that when an element (or area, layer, portion, etc.) is referred to as being "on", "connected to", or "coupled to" another element, it may be directly on, connected to, or coupled to the other element, or intervening elements may be present.

Like numbers refer to like elements throughout, and duplicative descriptions thereof may not be provided. The thicknesses, ratios, and dimensions of elements may be exaggerated in the drawings for clarity. As used herein, the term "and/or" includes any and all combinations of one or more of the associated listed items.

It will be understood that, although the terms "first", "second", etc. may be used herein to describe one or more elements, these terms should not be construed as limiting such elements. These terms are only used to distinguish one element from another element. Thus, a first element could be alternately termed a second element without departing from the spirit and scope of the present disclosure. Similarly, a second element could be alternately termed a first element. Singular forms of terms are intended to include the plural forms as well, unless the context clearly indicates otherwise.

Moreover, spatially relative terms, such as "beneath", "below", "lower", "above", "upper", and the like may be used herein for ease of description to describe one element's spatial relationship to another element(s) as illustrated in the drawings. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be further understood that the terms "includes" and "including", when used in this disclosure, specify the presence of stated features, integers, acts, operations, elements, and/or components, but do not preclude the presence or addition of one or more other features, integers, steps, operations, elements, components, and/or groups thereof.

FIG. 1A is a perspective view illustrating a first operation of a flexible display device DD according to an embodiment of the present disclosure.

Figure 1B:
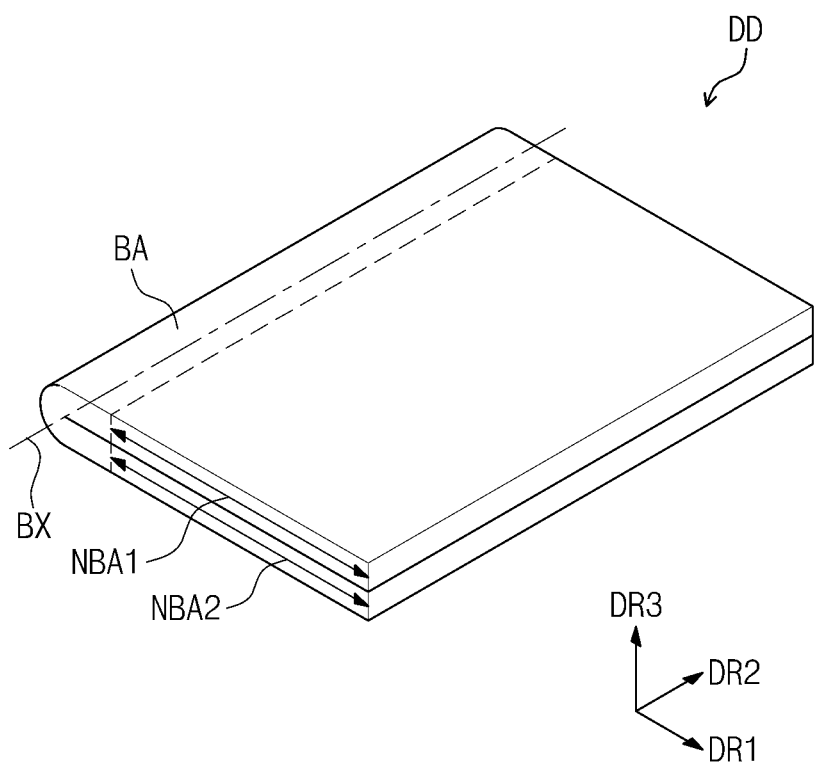
FIG. 1B is a perspective view illustrating a second operation of a flexible display device according to an embodiment of the present disclosure.

FIG. 1B is a perspective view illustrating a second operation of a flexible display device DD according to an embodiment of the present disclosure.

Figure 2A:
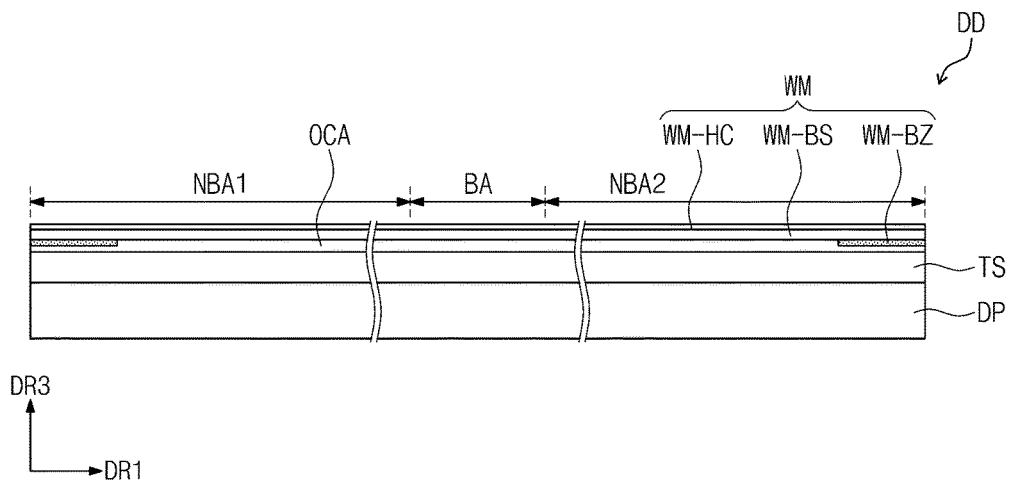
FIG. 2A is a cross-sectional view illustrating the first operation of a flexible display device according to an embodiment of the present disclosure.

FIG. 2A is a cross-sectional view illustrating the first operation of a flexible display device DD illustrating an embodiment of the present disclosure.

Figure 2B:
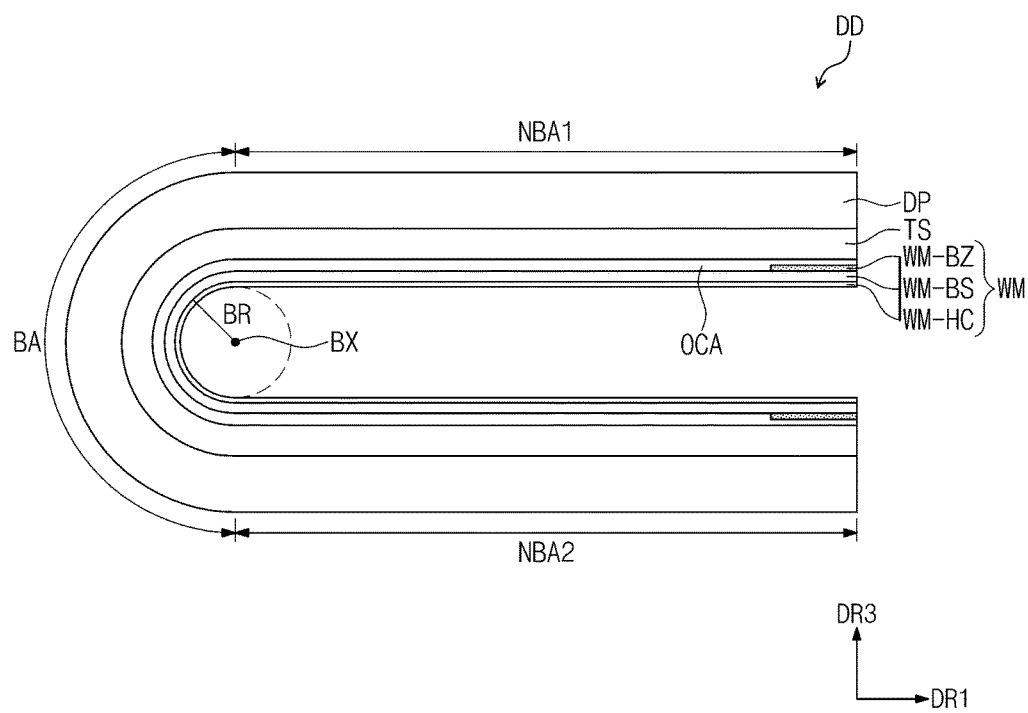
FIG. 2B is a cross-sectional view illustrating the second operation of a flexible display device according to an embodiment of the present disclosure.

FIG. 2B is a cross-sectional view illustrating the second operation of a flexible display device DD according to an embodiment of the present disclosure.

In the drawings, a display surface IS displaying an image IM is parallel (e.g., substantially parallel) to a plane defined by a first directional axis DR1 and a second directional axis DR2. A third directional axis DR3 indicates the normal (e.g., substantially normal) direction to the display surface IS, for example, the thickness direction of the flexible display device DD. The front and rear surfaces of each member may be described in terms of the third directional axis DR3. However, the directions indicated by the first to third directional axes DR1, DR2, and DR3 are relative directions, and may be converted to other directions (e.g., coordinate systems). Hereinafter, the first to third directions are the directions respectively indicated by the first to third directional axes DR1, DR2, and DR3, and are referred to by the same reference numerals.

FIGS. 1A-2B illustrate a foldable display device as an embodiment of a flexible display device DD. However, embodiments of the present disclosure are not limited thereto, and the flexible display device DD may be a curved flexible display device having a set (e.g., predetermined) curve, or a rollable flexible display device which can be rolled. Although not illustrated, the flexible display device DD according to an embodiment of the present disclosure may be used in a large electronic device (such as a television or a monitor), or in an intermediate or small electronic device (such as a mobile phone, a tablet, a car navigation system, a game, or a smartwatch).

As illustrated in FIG. 1A, a display surface IS in a flexible display device DD may be divided into a plurality of areas. The flexible display device DD may include a display area DD-DA that displays an image IM, and a non-display area DD-NDA that does not display the image IM. The non-display area DD-NDA is an area in which the image is not displayed. In FIG. 1A, a vase is illustrated as the example image IM, but the flexible display device DD is not limited thereto. In one embodiment, the display area DD-DA may be rectangular, but the flexible display device DD is not limited thereto. The non-display area DD-NDA may surround the display area DD-DA. However, embodiments of the present disclosure are not limited thereto, and the shape of the display area DD-DA and the shape of the non-display area DD-NDA may be designed relative to each other.

As illustrated in FIGS. 1A-1B, the display device DD may be defined according to a bending axis BX as including a bending area BA which bends, and a first non-bending area NBA1 and a second non-bending area NBA2, which do not bend (or which bend less than the bending area BA or substantially do not bend). The display device DD may be subject to inner-bending, such that the display surface IS in the first non-bending area NBA1 and the display surface IS in the second non-bending area NBA2 are facing each other.

The display device DD may be manipulated by a user so as to be subject to outer-bending, such that the display surface IS is externally exposed (e.g., the portions of the display surface IS in NBA1 and NBA2 are facing away from each other, and are on the outside).

In one embodiment of the present disclosure, the display device DD may include a plurality of bending areas BA. Moreover, the bending area BA may be defined so as to correspond with the user's manipulation of the display device DD. For example, unlike in FIG. 1B, the bending area BA may be defined parallel (e.g., substantially parallel) to the first directional axis DR1, and may also be defined in a diagonal (e.g., substantially diagonal) direction. The surface area of the bending area BA is not fixed, and may be determined according to a bending radius BR (see FIG. 2B).

As illustrated in FIGS. 2A and 2B, the display device DD may include a display panel DP, a touchscreen TS, and a window member WM. Each of the display panel DP, the touchscreen TS, and the window member WM may be flexible. Although not illustrated, the display device DD according to an embodiment of the present disclosure may further include a protective member that is coupled to the window member WM and may protect the display panel DP and the touchscreen TS. In one embodiment of the present disclosure, the touchscreen TS may be on the rear surface of the display panel DP, or may be integrated into the window member WM.

The display panel DP generates the image IM (e.g., an image as shown in FIG. 1A) corresponding to input image data. The display panel DP may be an organic light emitting display panel, an electrophoretic display panel, an electrowetting display panel, and/or the like, but embodiments of the display are not limited thereto. One embodiment of the organic light emitting display panel will be described as an example.

The touchscreen TS may receive coordinate data from an external input. The touchscreen TS may be on a base surface of the display panel DP. In one embodiment, the touchscreen TS may be manufactured with the display panel through a continuous (e.g., substantially continuous) process.

The touchscreen TS may be a capacitive touchscreen. However, embodiments of the touchscreen TS are not limited thereto, and may be substituted with a touchscreen using a different method (such as an electromagnetic induction method), and/or including two types or kinds of touch electrodes.

The window member WM may be coupled to the touchscreen TS using an optically clear adhesive OCA. The window member WM may include a flexible base member WM-BS, a bezel layer WM-BZ, and a hard coating layer WM-HC. The hard coating layer WM-HC may be on the front surface of the flexible base member WM-BS, and the bezel layer WM-BZ may be on the rear surface of the flexible base member WM-BS. In one embodiment of the present disclosure, the bezel layer WM-BZ may be excluded.

The flexible base member WM-BS may include a plastic film and/or the like. The flexible base member WM-BS may have a single-layered or a multi-layered structure, but embodiments of the lamination structure thereof are not limited thereto.

The bezel layer WM-BZ may partially overlap the flexible base member WM-BS. The bezel layer WM-BZ may define a bezel area, for example, the non-display area NDA (see FIG. 1A) in the display device DD. The bezel layer WM-BZ may be a colored organic layer.

The hard coating layer WM-HC may augment the low-hardness flexible base member WM-BS to increase the hardness of the window member WM. Below, a more detailed description of the hard coating layer WM-HC is given with reference to FIGS. 8 to 11.

Although not illustrated, the window member WM may further include a functional coating layer on the front surface of the window member WM-BS. The functional coating layer may include an anti-fingerprint layer, an antireflective layer, and/or the like.

Figure 3:
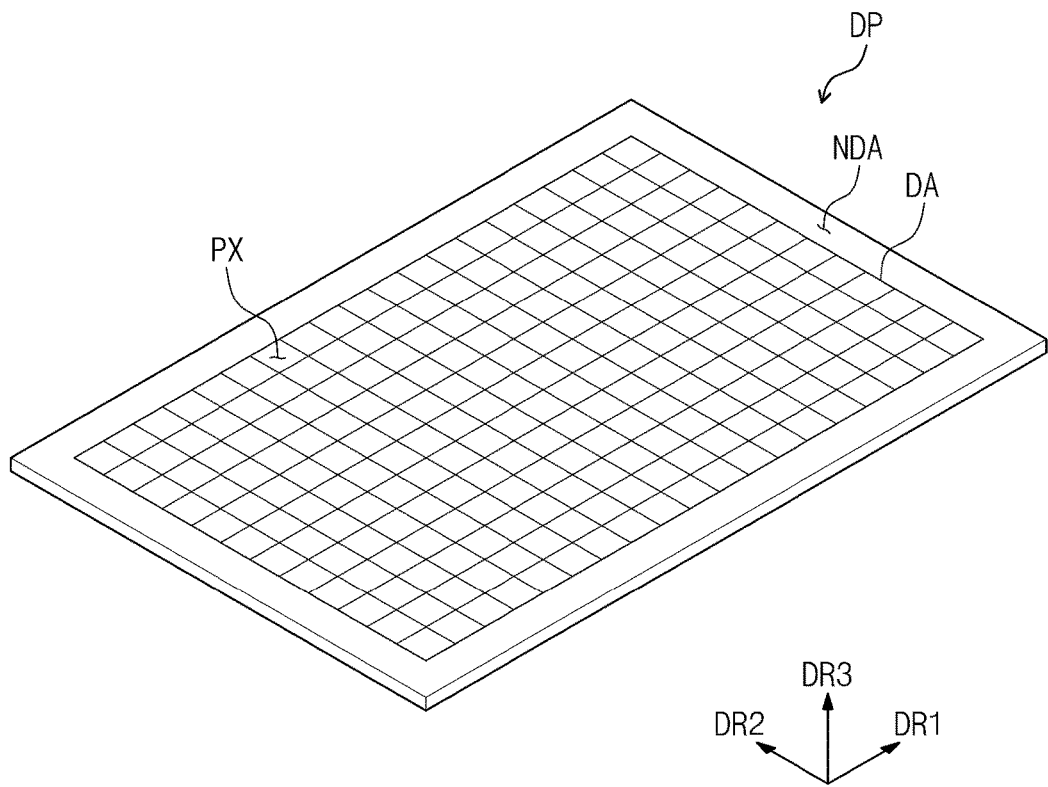
FIG. 3 is a perspective view of a flexible display panel according to an embodiment of the present disclosure.
Figure 4:
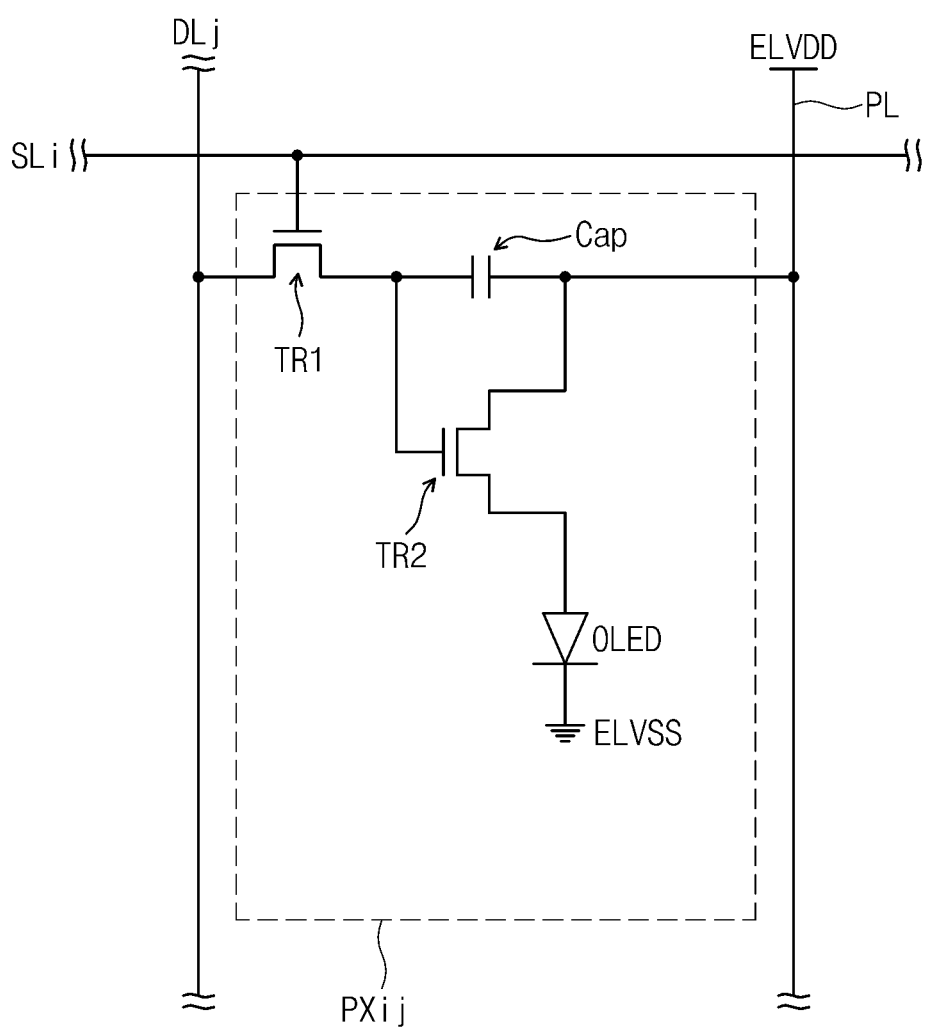
FIG. 4 is an equivalent circuit diagram of a pixel according to an embodiment of the present disclosure.

FIG. 3 illustrates a perspective view of a flexible display panel DP according to an embodiment of the present disclosure. FIG. 4 illustrates an equivalent circuit diagram of a pixel PX according to an embodiment of the present disclosure. Hereinafter, the flexible display panel DP is described as an organic light emitting display panel DP. When viewed as a plane, the organic light emitting display panel DP includes a display area DA and a non-display area NDA. The display area DA and the non-display area NDA in the organic light emitting display panel DP are not necessarily the same as the display area DD-DA and the non-display area DD-NDA defined in the display device DD by the bezel layer WM-BZ, and may change or may be modified according to the structure/design of the organic light emitting display panel DP.

As illustrated in FIG. 3, the organic light emitting display panel DP may include a plurality of pixels PX in the display area DA. The plurality of pixels PX is illustrated as a matrix, but embodiments of the present disclosure are not limited thereto. The plurality of pixels PX may be in a non-matrix form. For example, the plurality of pixels PX may be arranged in a PenTile form.

FIG. 4 illustrates the equivalent circuit diagram for a single pixel PXij connected to an ith scan line SLi and a jth source line DLj. Each of the plurality of pixels PX may have the same (or substantially the same) equivalent circuit.

The pixel PXij may include at least one transistor TR1 and TR2, at least one capacitor Cap, and an organic light emitting diode OLED. In the embodiment of FIG. 4, a pixel driver circuit including two transistors TR1 and TR2 and one capacitor Cap is illustrated, but configurations of the pixel driver circuit are not limited thereto.

An anode in the organic light emitting diode OLED receives a first power voltage ELVDD applied to a power line PL through a second transistor TR2. A cathode in the organic light emitting diode OLED receives a second power voltage ELVSS. A first transistor TR1 responds to a scanning signal applied to an ith scan line SLi and outputs a data signal that is applied to a jth source line DLj. The capacitor Cap charges at a voltage corresponding to the data signal received from the first transistor TR1. The second transistor TR2 controls the flow of a driving current corresponding to the voltage stored in the capacitor Cap to the organic light emitting diode OLED.

Figure 5:
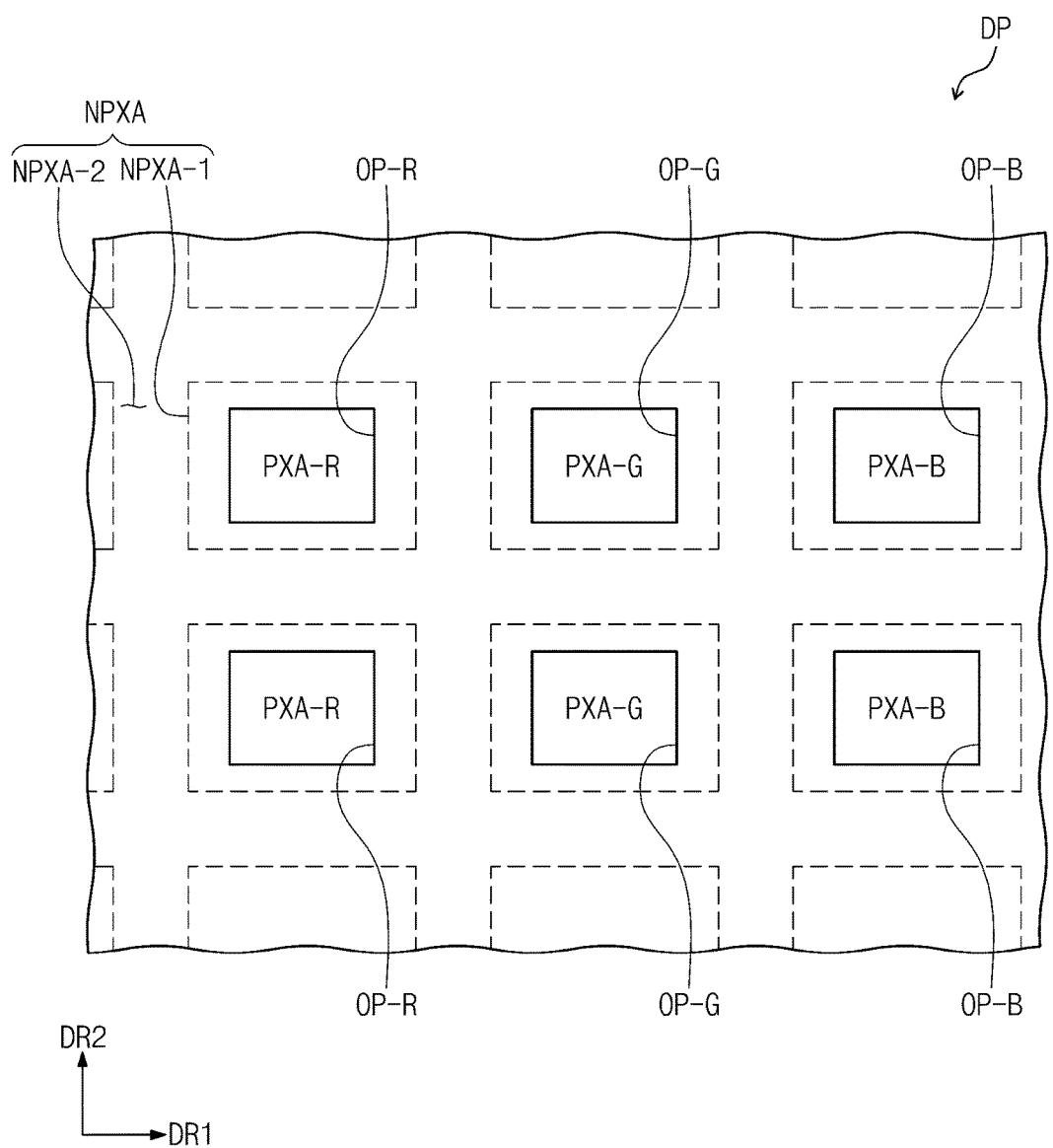
FIG. 5 is a partial plan view of an organic light emitting display panel according to an embodiment of the present disclosure.
Figure 6A:
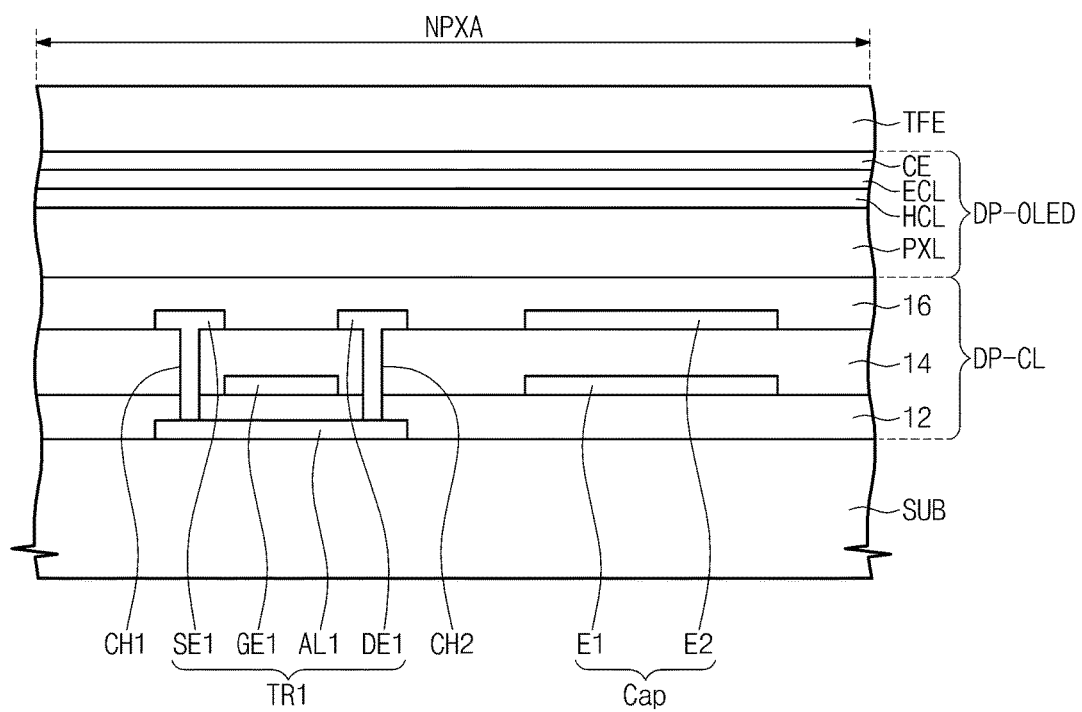
FIGS. 6A and 6B are partial cross-sectional views of an organic light emitting display panel according to an embodiment of the present disclosure.
Figure 6B:
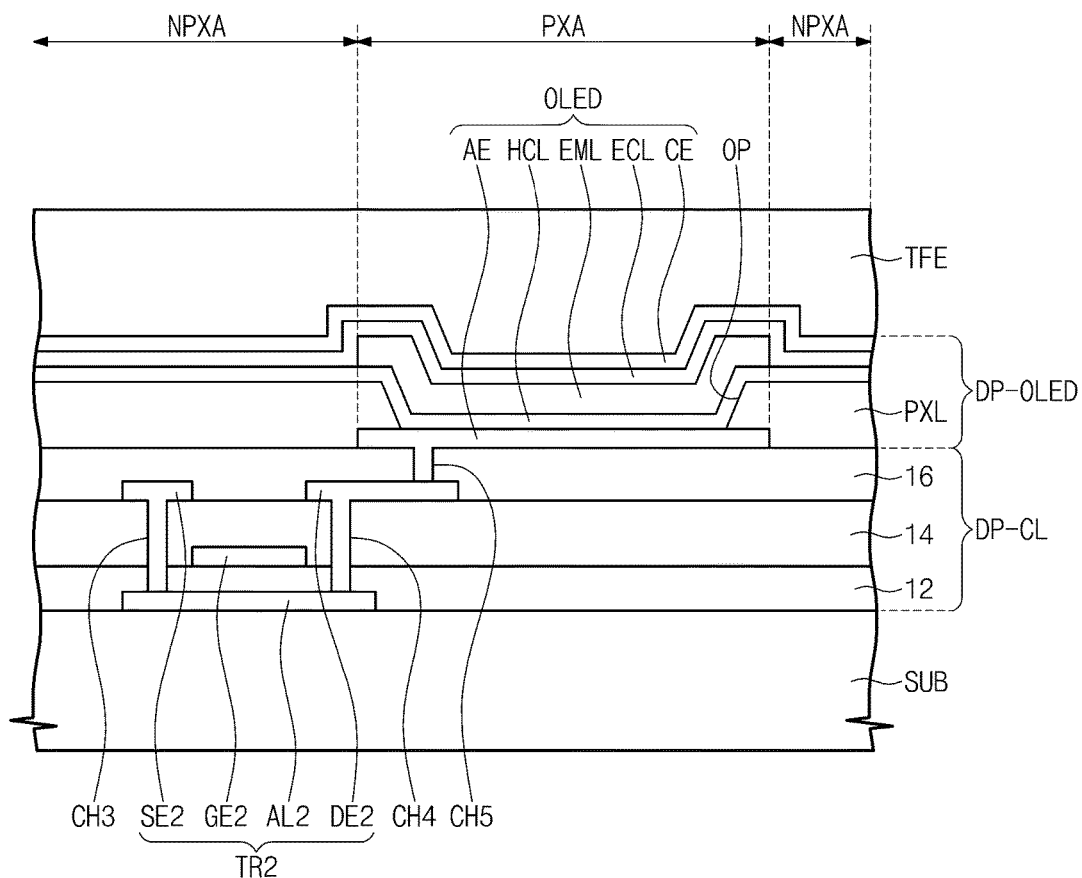

FIG. 5 is a partial plan view of an organic light emitting display panel DP according to an embodiment of the present disclosure. FIGS. 6A-6B are partial cross-sectional views of an organic light emitting display panel DP according to an embodiment of the present disclosure. FIG. 5 illustrates a portion of the display area DA (see FIG. 3). FIG. 6A illustrates a cross section of a portion corresponding to the first transistor TR1 and the capacitor Cap in the equivalent circuit illustrated in FIG. 4, and FIG. 6B illustrates a cross section of a portion corresponding to the second transistor TR2 and the organic light emitting diode OLED in the equivalent circuit illustrated in FIG. 4.

As illustrated in FIG. 5, an organic light emitting display panel DP is defined by a plurality of light emitting areas PXA-R, PXA-G, and PXA-B and a non-light emitting area NPXA in the plane defined the first directional axis DR1 and the second directional axis DR2. FIG. 5 illustrates three types of light emitting areas (e.g., three light emitting areas) PXA-R, PXA-G, and PXA-B, which are arranged in a matrix. Organic light emitting that emit three different types or ranges of colors may be positioned in the three types of light emitting areas (e.g., three light emitting areas) PXA-R, PXA-G, and PXA-B.

In one embodiment of the present disclosure, organic light emitting diodes that emit white-colored light may be positioned in the three types of light emitting areas (e.g., three light emitting areas) PXA-R, PXA-G, and PXA-B. Here, three types of differently colored color filters (e.g., three differently colored filters) may overlap the three types of light emitting areas (e.g., three light emitting areas) PXA-R, PXA-G, and PXA-B.

The non-light emitting area NPXA may be divided into a first non-light emitting area NPXA-1 that surrounds the light emitting areas PXA-R, PXA-G, and PXA-B, and a second non-light emitting area NPXA-2 that defines the boundaries of the first light emitting areas NPXA-1. Driver circuits corresponding to each pixel, for example, transistors TR1 and TR2 (see FIG. 4) or a capacitor Cap (see FIG. 4) may be positioned in each of the first non-light emitting areas NPXA-1. Signal lines, for example, a scan line SLi (see FIG. 4), a source line DLj (see FIG. 4), or a power line PL (see FIG. 4) may be positioned in the second non-light emitting area. However, embodiments of the present disclosure are not limited thereto, and the first non-light emitting areas NPXA-1 and the second non-light emitting area NPXA-2 may be indistinguishable from each other.

In one or more embodiments of the present disclosure, each of the light emitting areas PXA-R, PXA-G, and PXA-B may have a shape that is substantially similar to that of a rhombus. In one or more embodiments of the present disclosure, four light emitting diodes that emit differently colored light from each other may be respectively positioned in four types of repeatedly arranged light emitting regions (e.g., four different periodically arranged light emitting regions).

As used in the present specification, the phrase "emitting light of a predetermined color in a light emitting area" not only refers to emitting light generated by a corresponding light emitting diode, but may also refer to modifying the color of light that is generated in a light emitting diode to a suitable color prior to emitting the light.

As illustrated in FIGS. 6A-6B, an organic light emitting display panel DP may include a base substrate SUB, a circuit layer DP-CL, an organic light emitting diode layer DP-OLED, and a thin film encapsulation layer TFE. The circuit layer DP-CL may include a plurality of conductive layers and a plurality of insulating layers, and the organic light emitting layer DP-OLED may include a plurality of conductive layers and a plurality of functional organic layers. The thin film encapsulation layer TFE may include a plurality of organic layers and/or a plurality of inorganic layers.

The base substrate SUB is a flexible substrate and may include a plastic substrate (such as polyimide), a glass substrate, a metal substrate, and/or the like. A semiconductor pattern AL1 (hereinafter, a first semiconductor pattern) of a first transistor TR1 and a semiconductor pattern AL2 (hereinafter, a second semiconductor pattern) of a second transistor TR2 may be on the base substrate SUB. The first semiconductor pattern AL1 and the second semiconductor pattern AL2 may each include amorphous silicon formed at a low temperature. Other first and second semiconductor patterns AL1 and AL2 may include metal oxide semiconductors. Additional functional layers may be on a surface of the base substrate SUB. The functional layers may include at least one of a barrier layer or a buffer layer. The first semiconductor pattern AL1 and the second semiconductor pattern AL2 may be on the barrier layer or the buffer layer.

A first insulating layer 12 covering the first semiconductor pattern AL1 and the second semiconductor pattern AL2 may be on the base substrate SUB. The first insulating layer 12 may include an organic layer and/or an inorganic layer. In particular, the first insulating layer 12 may include a plurality of inorganic thin films. The plurality of inorganic thin films may include a silicon nitride layer and/or a silicon oxide layer.

A gate electrode GE1 (hereinafter, first gate electrode) of the first transistor TR1 and a gate electrode GE2 (hereinafter, second gate electrode) of the second transistor TR2 may be on the first insulating layer 12. A first electrode E1 of a capacitor Cap may be on the first insulating layer 12. The first gate electrode GE1, the second gate electrode GE2, and the first electrode E1 may be manufactured using the same (or substantially the same) photolithography process used for the scan line SLi (see FIG. 4). For example, the first electrode E1 may be formed of the same (or substantially the same) material as the scan line.

A second insulating layer 14 covering the first gate electrode GE1, the second gate electrode GE2, and the first electrode E1 may be on the first insulating layer 12. The second insulating layer 14 may include an organic layer and/or an inorganic layer. In particular, the second insulating layer 14 may include a plurality of inorganic thin films. The plurality of inorganic thin films may include a silicon nitride layer and/or a silicon oxide layer.

A source line DLj (see FIG. 4) and a power line PL (see FIG. 4) may be on the second insulating layer 14. A source electrode SE1 (hereinafter, first source electrode) and a drain electrode DE1 (hereinafter, first drain electrode) of the first transistor TR1 may be on the second insulating layer 14. A source electrode SE2 (hereinafter, second source electrode) and a drain electrode DE2 (hereinafter, second drain electrode) of the second transistor TR2 may be on the second insulating layer 14. The first source electrode SE1 is branched from the source line DLj. The second source electrode SE2 is branched from the power line PL.

A second electrode E2 of the capacitor Cap may be on the second insulating layer 14. The second electrode E2 may be manufactured according to substantially the same photolithography process and be made from the same (or substantially the same) material as the source line DLj and the power line PL.

The first source electrode SE1 and the first drain electrode DE1 may be connected to the first semiconductor pattern AL1 through a first through-hole CH1 and a second through-hole CH2, respectively, which pass through the first insulating layer 12 and the second insulating layer 14, respectively. The first drain electrode DE1 may be electrically connected to the first electrode E1. For example, the first drain electrode DE1 may be connected to the first electrode E1 through a through-hole passing through the second insulating layer 14. The second source electrode SE2 and the second drain electrode DE2 may be connected to the second semiconductor pattern AL2 through a third through-hole CH3 and a fourth through-hole CH4, respectively, which pass through the first insulating layer 12 and the second insulating layer 14, respectively. In one embodiment of the present disclosure, the first transistor TR1 and the second transistor TR2 may be modified to have bottom gate structures.

A third insulating layer 16 covering the first source electrode SE1, the first drain electrode DE1, the second source electrode SE2, and the second drain electrode DE2 may be on the second insulating layer 14. The third insulating layer 16 may include an organic layer and/or an inorganic layer. In particular, the third insulating layer 16 may include an organic material in order to provide a flat surface.

A pixel defining film PXL and an organic light emitting diode OLED may be on the insulating layer 16. An opening OP may be defined in the pixel defining film PXL. The pixel defining film PXL may be like (e.g., may be similar to) another insulating layer. The opening OP in FIG. 6B may correspond to the openings OP-R, OP-G, and OP-B in FIG. 5.

An anode AE may be connected to the second drain electrode DE2 through a fifth through-hole CHS, which passes through the third insulating layer 16. The opening OP in the pixel defining film PXL may expose at least a portion of the anode AE. A hole control layer HCL may be formed in the light emitting areas PXA-R, PXA-G, and PXA-B (see FIG. 5) and the non-light emitting layer NPXA (see FIG. 5). An organic light emitting layer EML and an electron control layer ECL may be successively formed on the hole control layer HCL. The hole control layer HCL may include at least a hole transport layer, and the electron control layer ECL may include at least an electron transport layer. Afterwards, a cathode CE may be commonly formed in the light emitting areas PXA-R, PXA-G, and PXA-B and the non-light emitting area NPXA. The cathode CE may be formed through deposition and/or sputtering according to the layered structure of the cathode CE.

A light emitting area PXA may be defined as the area in which light is generated. The light emitting area PXA may be defined so as to correspond to (e.g., be homologous with) the anode AE or light emitting layer EML in the organic light emitting diode OLED.

The thin film encapsulation layer TFE that encapsulates the organic light emitting diode layer DP-OLED may be on the cathode CE. The thin film encapsulation layer TFE may protect the organic light emitting diode OLED from moisture and foreign substances.

The thin film encapsulation layer TFE may include at least two inorganic thin films and an organic thin film therebetween. The inorganic thin films may protect the organic light emitting diode OLED from moisture, and the organic thin film may protect the organic light emitting diode OLED from foreign substances such as dust particles. The thin film encapsulation layer TFE may include a plurality of inorganic thin films and a plurality of organic thin films, which may be alternately stacked.

Figure 7A:
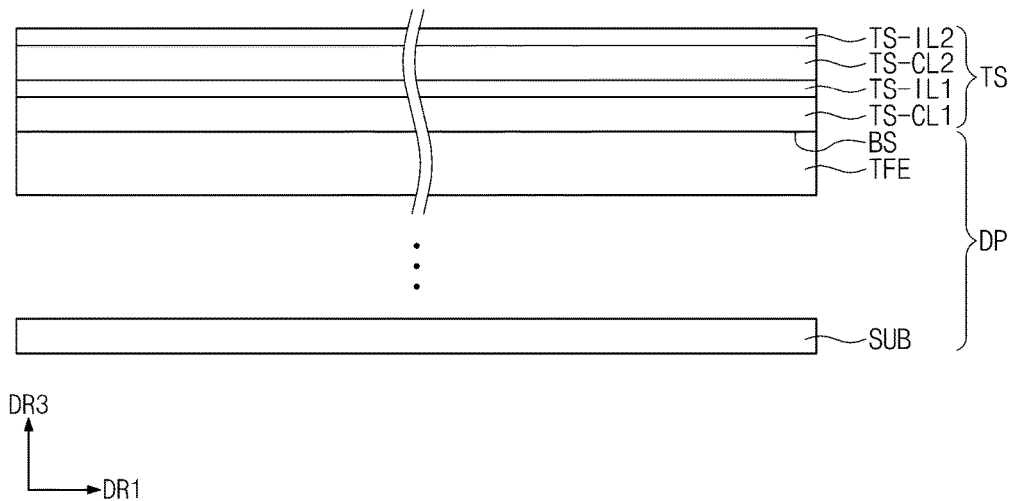
FIGS. 7A and 7B are cross-sectional views of a display device according to an embodiment of the present disclosure.
Figure 7B:
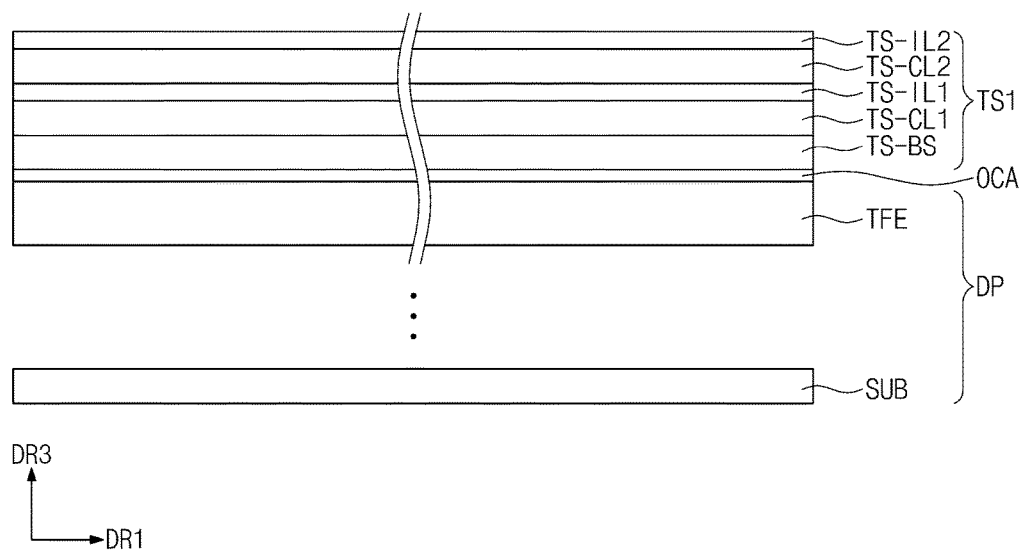

FIGS. 7A-7B are cross-sectional views of display devices according to an embodiment of the present disclosure. Structures of a display panel DP are schematically illustrated. Similarities and differences between display devices are described with reference to FIGS. 7A-7B.

As illustrated in FIG. 7A, a touchscreen TS includes a first conductive layer TS-CL1, a first insulating layer TS-IL1, a second conductive layer TS-CL2, and a second insulating layer TS-IL2. The touchscreen TS may be directly on a display panel DP. Each of the first conductive layer TS-CL1 and the second conductive layer TS-CL2 may have a single-layered structure or a multi-layered structure that is laminated along a third directional axis DR3. The multi-layered conductive layer may include a transparent conductive layer and at least one metal layer. The transparent conductive layer may include indium tin oxide (ITO), indium zinc oxide (IZO), zinc oxide (ZnO), indium tin zinc oxide (ITZO), PEDOT, a metal nanowire, or graphene. The metal layer may include molybdenum (Mo), silver (Ag), titanium (Ti), copper (Cu), aluminum (Al), or alloys thereof.

Each of the first conductive layer TS-CL1 and the second conductive layer TS-CL2 may include a plurality of patterns. The first conductive layer TS-CL1 may be on a thin film encapsulation layer TFE. For example, the thin film encapsulation layer TFE provides a base surface BS on which the touchscreen TS may be positioned. Each of the first insulating layer TS-IL1 and the second insulating layer TS-IL2 may include an inorganic layer or an organic layer.

As illustrated in FIG. 7B, a touchscreen TS1 may be coupled to a display panel DP using an optically clear adhesive OCA. The touchscreen TS1 may further include a flexible base member TS-BS in which a first conductive layer TS-CL1 is disposed.

Figure 8:
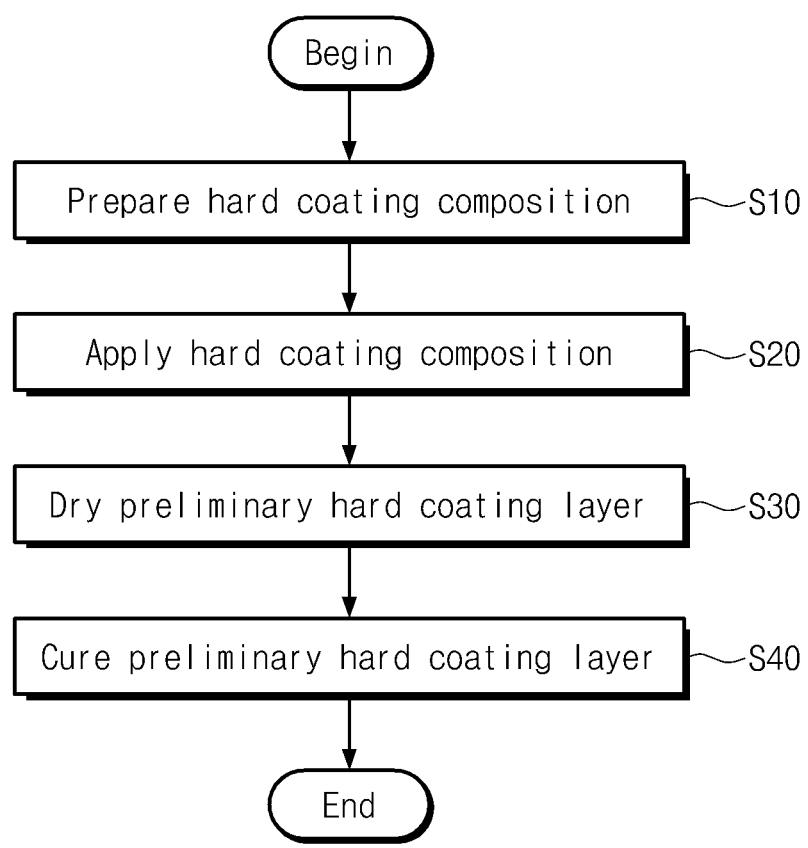
FIG. 8 is a flow chart illustrating a method for manufacturing a window member WM according to an embodiment of the present disclosure.
Figure 9A:
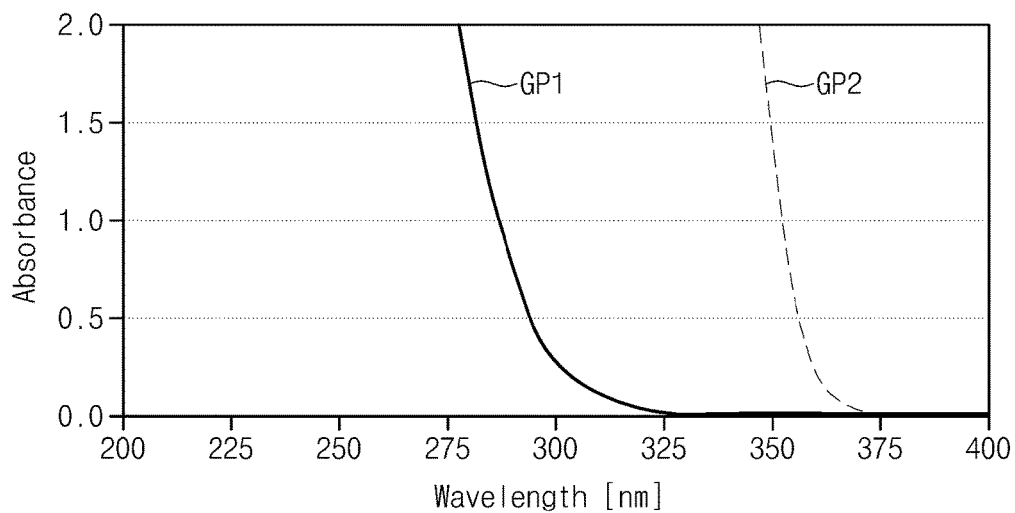
FIGS. 9A and 9B illustrate absorbance spectra of two types (e.g., classes) of photoinitiators.
Figure 9B:
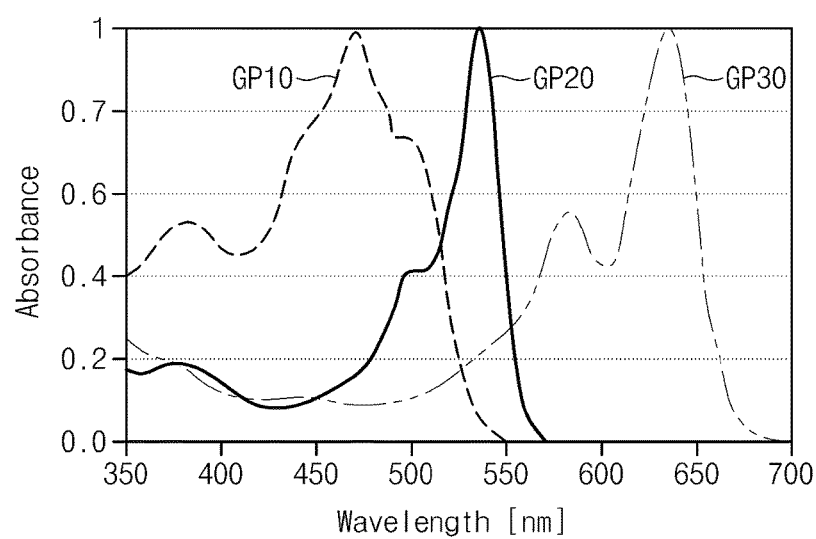
Figure 10:
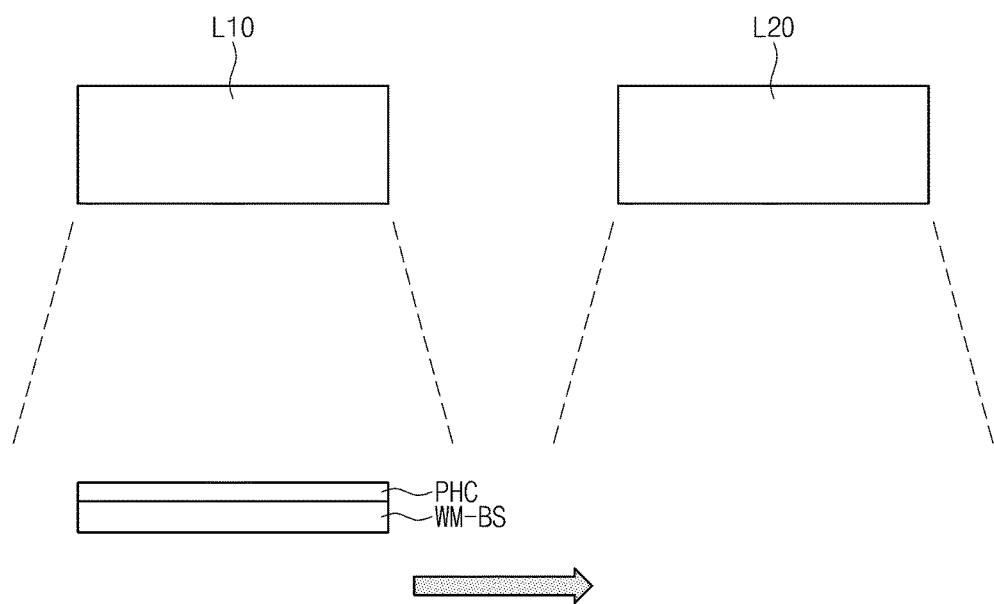
FIG. 10 illustrates a process for photo-curing a hard coating layer according to an embodiment of the present disclosure.

FIG. 8 is a flow chart illustrating a method for manufacturing a window member WM according to an embodiment of the present disclosure. FIGS. 9A-9B illustrate the absorbance spectra of two types (e.g., classes) of photoinitiators. FIG. 10 illustrates a process for photo-curing a hard coating layer according to an embodiment of the present disclosure.

Referring to FIG. 8, first, a hard coating composition is prepared (S10). The hard coating composition may include (e.g., contain) first oligomers, second oligomers, cross-linkers, and photoinitiators. In the present specification, the phrase "hard coating solid matter" refers to all of the components other than a solvent in the hard coating composition, for example, the first oligomers, the second oligomers, the cross-linkers, and the photoinitiators.

The solvent may include a ketone-based solvent or an ether-based solvent. The ketone-based solvent may include methyl ethyl ketone, acetophenone, cyclopentanone, ethyl isopropyl ketone, 2-hexanone, isophorone, mesityl oxide, methyl isobutyl ketone, 3-methyl-2-pentanone, 2-pentanone, 3-pentanone, and/or the like. The ether-based solvent may include cyclopentyl methyl ether (CPME), diethylene glycol diethyl ether, dimethoxymethane, methyl tent-butyl ether, 2-(2-methoxyethoxy)ethanol, propylene glycol ether, and/or the like.

The first oligomers and the second oligomers may have different molecular weights. For example, the hard coating composition may contain two types of oligomers that are differentiated by molecular weight. The molecular weight of the first oligomers may be 2,000 to 6,000, and the molecular weight of the second oligomers may be 10,000 to 30,000. The first oligomers may increase the hardness of the hard coating layer and the second oligomers may increase the flexibility of the hard coating layer.

In one embodiment of the present disclosure, the molecular weight of the first oligomers may be substantially identical to each other (e.g., the molecular weight distribution of the first oligomers may be narrow or relatively narrow). For example, the molecular weight of the first oligomers may be about 4,000. Here, the deviation in the molecular weight of the first oligomers may be about −5% to about +5%.

In one embodiment of the present disclosure, the first oligomers may include groups having different molecular weights. For example, some of the first oligomers may have a molecular weight of about 2,000 and some of the first oligomers may have a molecular weight of about 4,000.

Here, the deviation in the molecular weight of the first oligomers may be about −5% to about +5%, regardless of group.

Each of the first oligomers may be represented by Formula 1:

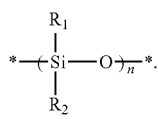

Formula 1

In Formula 1, n may be an integer selected from 8 to 30. n may be an integer selected from 8 to 10 when each of the first oligomers has a molecular weight of about 2,000, from 18 to 20 when each of the first oligomers has a molecular weight of about 4,000, and from 28 to 30 when each of the first oligomers has a molecular weight of about 6,000. As described below, the range of n according to the molecular weight may vary, depending on the type (e.g., group) of the below-described $R_1$ and $R_2$.

$R_1$ may be a hydroxy group, a substituted or unsubstituted aryl group having 6 to 30 carbon atoms for forming a ring, an alkoxy group, a substituted or unsubstituted alkyl group having 1 to 20 carbon atoms, or a photoinitiated reactive group. In Formula 1, "———*" indicates a part which connects to (e.g., indicates a bonding position to) another repeating unit.

At least one of the plurality of $R_1$(s) may be a photoinitiated reactive group. In the present specification, the term "photoinitiated reactive group" may refer to a reactive group including a part (e.g., chemical moiety) which reacts when light is emitted (or incident) thereon. For example, a photoinitiator may form a radical or a cation due to light (e.g., upon absorption of light energy), and a photoinitiated reactive group may indicate a reactive group that includes a part (e.g., chemical moiety) that reacts due to (e.g., reacts with) the radical or the cation.

The photoinitiated reactive group may include, for example, an ester group substituted with an epoxy group or an alkenyl group, an alkyl group having 1 to 20 carbon atoms and substituted with an epoxy group or an alkenyl group, or a substituted or unsubstituted alkenyl group having 1 to 20 carbon atoms.

The photoinitiated reactive group may be represented by Formula 4 or Formula 5:

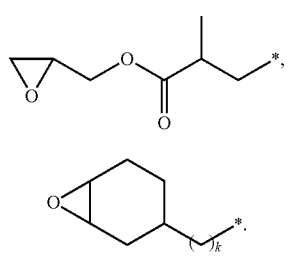

Formula 4

Formula 5

In Formula 5, k may be an integer selected from 1 to 10.

$R_2$ may be a hydroxy group, a substituted or unsubstituted aryl group having 6 to 30 carbon atoms for forming a ring, an alkoxy group, a substituted or unsubstituted alkyl group having 1 to 20 carbon atoms, or a photoinitiated reactive group.

Each of the second oligomers may be represented by Formula 3. In one embodiment of the present disclosure, the molecular weight of the second oligomers may be substantially identical to each other (e.g., the molecular weight distribution of the first oligomers may be narrow or relatively narrow). For example, the molecular weight of the second oligomers may be about 10,000. Here, the deviation in the molecular weight of the second oligomers may be about −5% to about +5%.

In one embodiment of the present disclosure, the second oligomers may include groups having different molecular weights. For example, some of the second oligomers may have a molecular weight of about 10,000, and some may have a molecular weight of about 12,000. Here, the deviation in the molecular weight of the second oligomers may be about −5% to about +5%, regardless of the included groups.

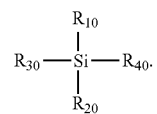

Formula 3

In Formula 3, m may be an integer selected from 36 to 150. In one or more embodiments, m in Formula 3 may be an integer selected from 46 to 150. For example, m may be an integer selected from 46 to 50 when each of the second oligomers has a molecular weight of about 10,000. As described below, the range of m according to the molecular weight may vary depending on the type (e.g., group) of the below-described $R_3$ and $R_4$.

$R_3$ may be a hydroxy group, a substituted or unsubstituted aryl group having 6 to 30 carbon atoms for forming a ring, an alkoxy group, a substituted or unsubstituted alkyl group having 1 to 20 carbon atoms, or a photoinitiated reactive group. At least one of the plurality of $R_3$(s) may be a photoinitiated reactive group. $R_4$ may be a hydroxy group, a substituted or unsubstituted aryl group having 6 to 30 carbon atoms for forming a ring, an alkoxy group, a substituted or unsubstituted alkyl group having 1 to 20 carbon atoms, or a photoinitiated reactive group.

The same (e.g., identical) monomers may be used to produce first oligomers and second oligomers having different molecular weights. Each of the first oligomers and the second oligomers may be synthesized using a monomer represented by Formula 10:

$$R_{30}-\underset{\underset{R_{20}}{|}}{\overset{\overset{R_{10}}{|}}{Si}}-R_{40}.$$

Formula 10

$R_{10}$ in Formula 10 may correspond to $R_1$ in Formula 1 and $R_3$ in Formula 4. $R_{20}$ in Formula 10 may correspond to $R_2$ in Formula 1 and $R_4$ in Formula 4. $R_{30}$ and $R_{40}$ may each independently be a hydroxy group or an alkoxy group. Here, the alkoxy group may be represented by —OR, and R may be an alkyl group having 1 to 20 carbon atoms.

The monomer represented by Formula 10 may be catalytically reacted to synthesize each of the first oligomers and the second oligomers. The reaction time may be controlled (e.g., selected) to control the molecular weight of the first and second oligomers. The catalyst may include Ba(OH)

$_2.H_2O$. The type or class of catalyst is not limited thereto, and catalyst materials in which a sol-gel reaction can occur may be sufficient or suitable. The catalytic reaction may occur in a solution state. The solvent used for the oligomer synthesis may be substantially the same as the solvent in the hard coating composition.

In the present specification, a cross-linker that connects oligomers through a cross-linking reaction may be sufficient or suitable, and the type thereof (e.g., cross-linker) is not limited. In one embodiment of the present disclosure, the cross-linker may include alicyclic diepoxy carboxylate. In one embodiment of the present disclosure, the cross-linker may be 4-vinylcyclohexene dioxide, cyclohexene vinyl monoxide, (3,4-epoxycyclohexyl)methyl 3,4-epoxycyclohexylcarboxylate, 3,4-epoxycyclohexylmethyl methacrylate, bis(3,4-epoxycyclohexylmethyl)adipate, 3,4-epoxycyclohexanecarboxylate, or 2-(3,4-epoxycyclohexyl)-1,3-dioxolane.

In one or more embodiments, the cross-linkers may include a monomer represented by Formula 6B, or an oligomer (hereinafter, cross-linking oligomer) synthesized from the monomer represented by Formula 6:

Formula 6B

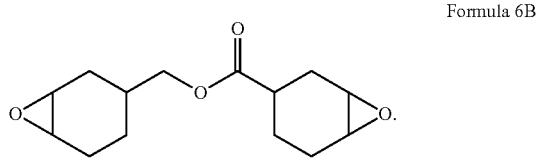 [SMILES: O=C(OCC1CCC2OC2C1)C1CCC2OC2C1]

The cross-linking oligomer may be represented by Formula 6. In Formula 6, h may be an integer selected from 1 to 7:

Formula 6

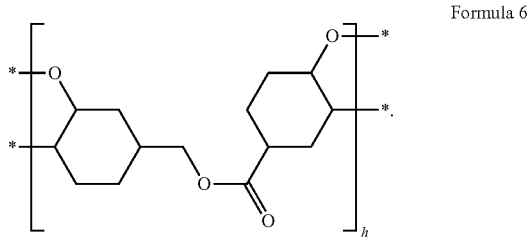

The cross-linking oligomers may be synthesized via a catalytic reaction. The cross-linking oligomers may be synthesized using a similar method to the method used for the above-described first oligomers or second oligomers. The cross-linking oligomers may be synthesized independently of the first oligomers and the second oligomers, or may be successively synthesized by introducing cross-linking monomers to a solution in which the first oligomers or the second oligomers have been synthesized.

The photoinitiator may include at least one of a free radical type initiator (e.g., an initiator generating a free radical) or a cationic type initiator (e.g., an initiator generating a cation). The photoinitiator may include at least two types or kinds of photoinitiators that are initiated by light of different wavelengths. For example, the photoinitiator may include a short wavelength initiator and a long wavelength initiator.

As illustrated in FIG. 9A, the photoinitiator may include a first photoinitiator and a second photoinitiator, which may be activated by different (e.g., distinct) wavelength ranges of ultraviolet radiation. The first photoinitiator may have the absorbance spectrum of the first graph GP1, and the second photoinitiator may have the absorbance spectrum of the second graph GP2.

As illustrated in FIG. 9B, the photoinitiator may include a first photoinitiator, a second photoinitiator, and a third photoinitiator, which may be activated by different (e.g., distinct) wavelength ranges of ultraviolet radiation. For example, the first photoinitiator may have the absorbance spectrum of the first graph GP10, the second photoinitiator may have the absorbance spectrum of the second graph GP20, and the third photoinitiator may have the absorbance spectrum of the third graph GP30.

In one embodiment of the present disclosure, the hard coating composition may further include a first additive in order to improve the flexibility of the hard coating layer that is to be prepared. The first additive may include a bisphenol-A-epoxy-silicone block copolymer. The bisphenol-A-epoxy-silicone block copolymer has a linear structure, and may have a function of bonding with the first oligomers, the second oligomers, and/or the cross-linkers in order to elongate or extend the molecular structure of the hard coating polymer. Therefore, the flexibility of the hard coating layer may be further improved.

In one embodiment of the present disclosure, the hard coating composition may further include a second additive in order to improve the hardness of the hard coating layer that is to be prepared. The second additive may include silicon nanoparticles. The silicon nanoparticles may be interspersed between the formed hard coating polymers to further improve the hardness of the hard coating layer.

The hard coating composition may contain 6 wt % to 36 wt % of the first oligomers, 36 wt % to 70 wt % of the second oligomers, 10 wt % to 20 wt % of the cross-linkers, and 1 wt % to 4 wt % of the photoinitiators with respect to 100 wt % of the hard coating solid matter. The hard coating composition may further contain an additive for controlling the flexibility and hardness of the hard coating layer. The hard coating composition may further contain 0 wt % to 4 wt % of each of the first additive and the second additive with respect to 100 wt % of the hard coating solid matter.

Next, as illustrated in FIG. 8, the prepared hard coating composition is positioned on a surface of a flexible base member WM-BS (see FIGS. 2A and 2B) (S20). The hard coating composition may be applied using a suitable method (such as roll-to-roll coating, spin coating, slit coating, bar coating, and/or inkjet printing). The hard coating composition applied onto a surface of the base member WM-BS may form a preliminary hard coating layer.

Next, the preliminary hard coating layer is dried (S30). The solvent in the preliminary hard coating layer is removed. The dried preliminary hard coating layer may be a mixed layer having a set (e.g., predetermined) viscosity. In one embodiment of the present disclosure, the dried preliminary hard coating layer may not only include the first oligomers, the second oligomers, the cross-linkers, and the photoinitiators, but may further include the first additive or the second additive.

Afterwards, the dried preliminary hard coating layer is photo-cured (S40). A photoreaction may be initiated (e.g., activated) by a photoinitiator when light is emitted thereon. Photoinitiated reactive groups in each of the first oligomers, the second oligomers, and the cross-linkers may be activated by the photoinitiator. The photoinitiated reactive groups in the cross-linkers may bond with the photoinitiated reactive groups in the first and second oligomers. The hard coating polymer is synthesized as the cross-linkers connect (e.g., couple) the first oligomers and the second oligomers. Accordingly, the hard coating layer WM-HC illustrated in FIGS. 2A and 2B may be formed.

The hard coating layer may be aged in order to stabilize the photo-cured hard coating layer. The hard coating layer may be subjected to a primary aging at room temperature and a secondary aging at high temperature/high humidity (for example, 60° C./93%).

When the hard coating composition includes a plurality of types of photoinitiators (e.g., two or more classes of photoinitiators) that are activated by different (e.g., distinct) wavelength ranges of ultraviolet radiation, light having different wavelength ranges may be successively emitted using a plurality of light sources L10 and L20, as illustrated in FIG. 10. FIG. 10 illustrates as an example two light sources L10 and L20.

When light having a first wavelength range from the first light source L10 is emitted onto the preliminary hard coating layer PHC, the first oligomers, the second oligomers, and the cross-linking oligomers may be partially chemically bonded (e.g., coupled) by one type or class of photoinitiator among the plurality of types or classes of photoinitiators. When light having a second wavelength range from the second light source L20 is subsequently emitted onto the preliminary hard coating layer PHC, the cross-linkers may connect (e.g., couple) the first oligomers and the second oligomers a second time.

By photo-curing the hard coating layer using the plurality of types or classes of photoinitiators and the corresponding plurality of light sources, the hard coating polymer may be uniformly (e.g., substantially uniformly) synthesized. Since the depth to which light reaches (e.g., penetrates) differs according to the wavelength of the light, the light may be uniformly (e.g., substantially uniformly) provided regardless of the thickness of the hard coating layer PHC.

Figure 11:
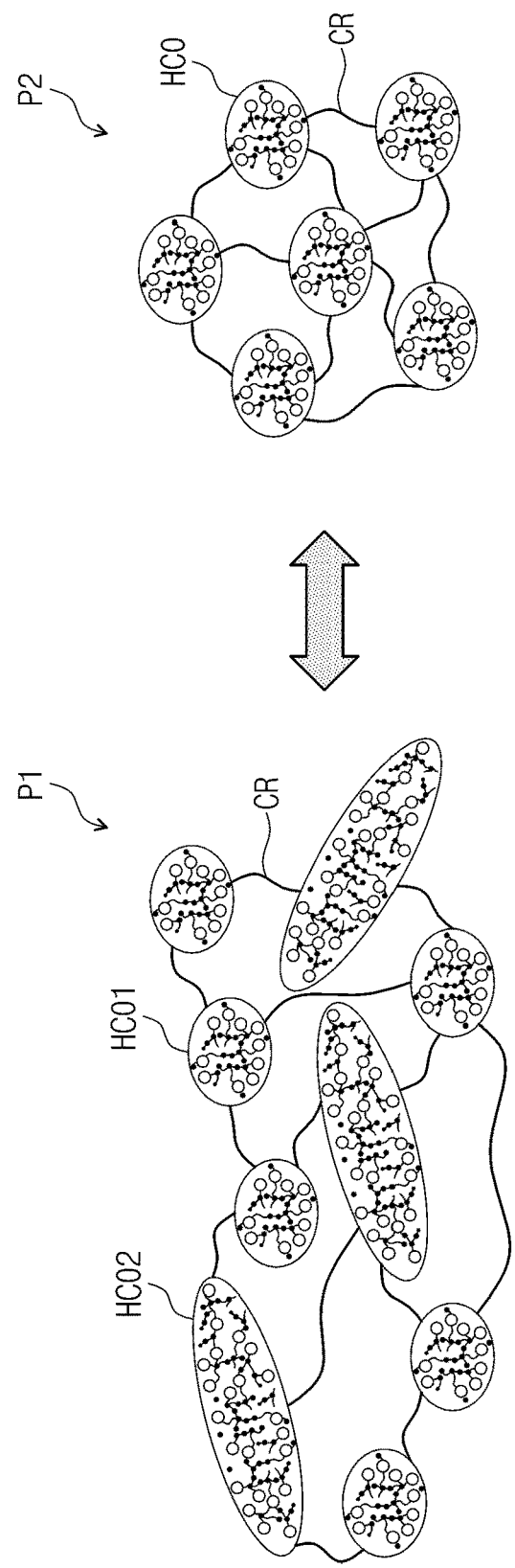
FIG. 11 illustrates the structures of a hard coating polymer according to an embodiment of the present disclosure and a hard coating polymer according to a comparative example.

FIG. 11 illustrates a hard coating polymer according to an embodiment of the present disclosure and a hard coating polymer according to a comparative example.

A first polymer P1 illustrated in FIG. 11 corresponds to a portion of a hard coating layer prepared according to an embodiment of the present disclosure. The first polymer P1 includes first oligomers HCO1, second oligomers HCO2 having a larger molecular weight than the first oligomers HCO1, and cross-linking oligomers CR which connect (e.g., couple) the first and second oligomers HCO1 and HCO2. The first polymer P1 was synthesized according to methods described with reference to FIGS. 8 to 10.

The hard coating layer according to an embodiment of the present disclosure may include a polymer (such as the polymer represented by Formula 1):

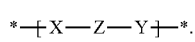

Formula 1

In Formula 1, X may be a hard coating oligomer (such as the oligomer represented by Formula 2), Y may be a hard coating oligomer (such as the oligomer represented by Formula 3), and Z may be a monomer (such as the monomer represented by Formula 6B) or a cross-linking oligomer (such as the cross-linking oligomer) represented by Formula 6. The hard coating layer may have a thickness of 10 to 100 μm. The hard coating layer may have a molecular weight of 50,000 to 100,000 per unit surface area (1 mm²).

The thickness of the hard coating layer may change according to the thickness of the flexible base member WM-BS (see FIGS. 2A and 2B). The hard coating layer having the above-described thickness may be used for the flexible base member WM-BS having a thickness of 20 μm to 100 μm.

The hard coating layer according to an embodiment of the present disclosure may further include at least one of a polymer represented by Formula 1A or a polymer represented by Formula 1B.

Formula 1A

Formula 1B

In Formula 1A and Formula 1B, X may be a hard coating oligomer (such as the oligomer represented by Formula 2), Y may be a hard coating oligomer (such as the polymer represented by Formula 3), and Z may be a monomer (such as the monomer represented by Formula 6B) or a cross-linking oligomer (such as the cross-linking oligomer represented by Formula 6).

A second polymer P2 illustrated in FIG. 11 corresponds to a portion of a hard coating layer according to a comparative example. The second polymer P2 includes hard coating oligomers HCO and cross-linking oligomers CR connecting the same. The second polymer P2 includes one type of the hard coating oligomers represented by Formula 2 or Formula 3, and a monomer (such as the monomer represented by Formula 6B) or a cross-linking oligomer (such as the cross-linking oligomer represented by Formula 6) that connects the hard coating layers. For example, the second polymer P2 may only include polymers (such as the polymer represented by Formula 1A or Formula 1B).

The hard coating layer according to embodiments of the present disclosure may maintain a predetermined hardness while improving flexibility. A more detailed description is provided with reference to Table 1 and Table 2:

TABLE 1

| | Average molecular weight of oligomers | n in Formula 1 or m in Formula 4 | Surface hardness/ indentation hardness | Bending stiffness (N)- radius of curvature 2.5 mm |
|---|---|---|---|---|
| Comparative Example 1 | 2,000 | 8-10 | 9H/2H | 7 |
| Comparative Example 2 | 4,000 | 16-20 | 9H/2H | 6.5 |
| Comparative Example 3 | 6,000 | 26-30 | 9H/1H | 5.2 |
| Comparative Example 4 | 8,000 | 36-40 | 7H/2B | 4.1 |
| Comparative Example 5 | 10,000 | 46-50 | 6H/3B | 3.9 |
| Comparative Example 6 | 15,000 | 65-70 | 5H/3B | 3.2 |
| Comparative Example 7 | 30,000 | 125-130 | 4H/4B | 2.4 |

Each of the hard coating layers in Comparative Examples 1 to 7 was synthesized using a monomer represented by Formula 6B, and hard coating oligomers synthesized using a monomer represented by Formula 11.

Each of the hard coating layers in Comparative Examples 1 to 7 contains one type or kind of oligomer, the oligomers having different molecular weights from each other (e.g., the molecular weights of the oligomers were different in each Comparative Example). Each of the hard coating layers in Comparative Examples 1 to 7 was synthesized using a hard coating solid matter containing 88.5 wt % of hard coating oligomers, 10 wt % of a cross-linker, and 1.5 wt % of a cationic type initiator (e.g., an initiator generating a cation) with respect to 100 wt % of the respective hard coating solid matter. Other conditions for preparing the hard coating layers were identical.

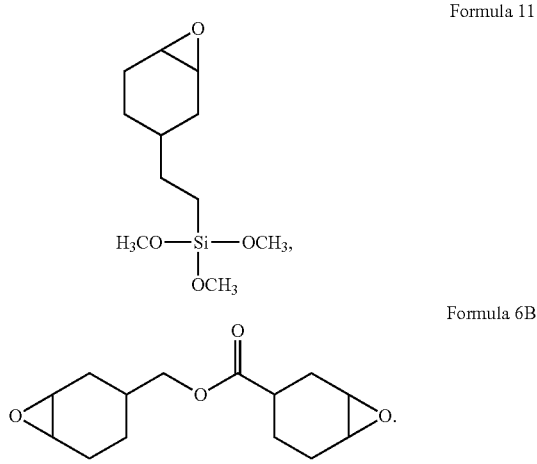

Formula 11

Formula 6B

TABLE 2

| | Average molecular weight of first oligomers | Average molecular weight of second oligomers | Surface hardness/ indentation hardness | Bending stiffness (N)- radius of curvature 2.5 mm |
| --- | --- | --- | --- | --- |
| Example 1 | 2,000 | 10,000 | 9H/2H | 6.2 |
| Example 2 | 4,000 | 10,000 | 9H/2H | 4.5 |
| Example 3 | 6,000 | 10,000 | 8H/1B | 4.1 |

Each of the hard coating layers of Examples 1 to 3 was synthesized using first oligomers synthesized with a monomer represented by Formula 11, second oligomers synthesized with a monomer represented by Formula 11, and a monomer represented by Formula 6B.

Each of the hard coating layers of Examples 1 to 3 contains two types or kinds of oligomers, but the molecular weights of the first oligomers are different from each other (e.g., the molecular weights of the first oligomers are different in each Example). Each of the hard coating layers of Examples 1 to 3 was synthesized using the hard coating solid matter containing 88.5 wt % of the hard coating oligomers, 10 wt % of a cross-linker, and 1.5 wt % of a cationic type initiator (e.g., an initiator generating a cation) with respect to 100 wt % of the respective hard coating solid matter. Other conditions for preparing the hard coating layers were identical. Each of the hard coating layers of Examples 1 to 3 contains a 50:50 ratio of the first oligomers to the second oligomers.

The oligomers contained in the hard coating layer may be observed through x-ray diffraction (XRD) analysis. Differences in the peaks in the spectrum may be analyzed as corresponding to differences in the molecular weight of the oligomers.

According to Comparative Examples 1 to 7, the hard coating layer containing an oligomer having a small molecular weight may have a high hardness but a low flexibility, and the hard coating layer containing an oligomer having a large molecular weight may have a high flexibility but a low hardness. Since only one property selected from hardness and flexibility may be satisfied, such hard coating layers may be inappropriate or unsuitable for use as the hard coating layer in a flexible window.

According to Examples 1 to 4, a relatively high flexibility is achieved while maintaining a high hardness compared to Comparative Examples 1 to 7. Thus, the hard coating layer is not damaged even when a flexible display device is bent, and/or when the hard coating layer is subject to an external impact.

The hard coating layers displayed in Table 3 contain different ratios of the first oligomers and the second oligomers:

TABLE 3

| | Percentage of first oligomers | Percentage of second oligomers | Surface hardness/ indentation hardness | Bending stiffness (N)- radius of curvature 3 mm |
| --- | --- | --- | --- | --- |
| Example 2 | 50% | 50% | 9H/2H | 4.5 |
| Example 4 | 40% | 60% | 9H/2H | 4.3 |
| Example 5 | 30% | 70% | 9H/2H | 4.2 |
| Example 6 | 20% | 80% | 8H/2H | 4.0 |

Each of the hard coating layers of Examples 4 to 6 was synthesized using first oligomers synthesized with a monomer represented by Formula 11, second oligomers represented by Formula 11, and a monomer represented by Formula 6B.

Each of the hard coating layers of Examples 4 to 6 was synthesized using a hard coating solid matter containing 88.5 wt % of the hard coating oligomers, 10 wt % of a cross-linker, and 1.5 wt % of a cationic type initiator (e.g., an initiator generating a cation) with respect to 100 wt % of the respective hard coating solid matter. Other conditions for preparing the hard coating layers were identical. Each of the hard coating oligomers of Examples 4 to 6 contains the first oligomers having a molecular weight of 4,000 and the second oligomers having a molecular weight of 10,000.

The ratio of the first oligomers to the second oligomers may be about 50:50 to 20:80. By adjusting the ratio between the first oligomers and the second oligomers, the hardness and flexibility of the hard coating layer may be controlled.

A flexible display device according to an embodiment of the present disclosure may include a coating layer having an improved hardness and flexibility. Thus, a window member providing an external surface of the flexible display is not damaged when subject to an external impact or when bent.

In a method for preparing a window member according to an embodiment of the present disclosure, photoinitiators which absorb light of different wavelengths from each other may be included such that a hard coating layer is sufficiently or suitably cured.

As used herein, expressions such as "at least one selected from", "one of", and "selected from", when preceding a list of elements, modify the entire list of elements and do not modify the individual elements of the list. Further, the use of "may" when describing embodiments of the present disclosure refers to "one or more embodiments of the present disclosure".

In some embodiments, as used herein, the terms "use", "using", and "used" may be considered synonymous with the terms "utilize", "utilizing", and "utilized", respectively.

As used herein, the terms "substantially", "about", and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, For example, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims and equivalents thereof, to expressly recite any sub-range subsumed within the ranges expressly recited herein.

Although example embodiments of the present disclosure have been described with reference to the drawings, it will be understood that the present disclosure should not be limited to these example embodiments, and that various changes and modifications may be made by one of ordinary skill in the art within the spirit and scope of the present disclosure as defined by the following claims and equivalents thereof.

What is claimed is:

1. A flexible display device comprising:
a flexible display panel; and
a window member on the flexible display panel,
wherein the window member comprises a flexible base member and a hard coating layer on the flexible base member, the hard coating layer containing a photoinitiator and a polymer represented by Formula 1,

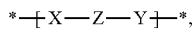

Formula 1 wherein in Formula 1,
X is represented by Formula 2,

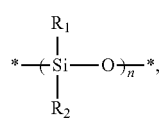

Formula 2 in which n is an integer selected from 8 to 30; $R_1$ is a hydroxy group, a substituted or unsubstituted aryl group having 6 to 30 carbon atoms for forming a ring, an alkoxy group, a substituted or unsubstituted alkyl group having 1 to 20 carbon atoms, or a photoinitiated reactive group; at least one of the plurality of $R_1$(s) is a photoinitiated reactive group; and $R_2$ is a hydroxy group, a substituted or unsubstituted aryl group having 6 to30 carbon atoms for forming a ring, an alkoxy group, a substituted or unsubstituted alkyl group having 1 to 20 carbon atoms, or a photoinitiated reactive group;

Y is represented by Formula 3,

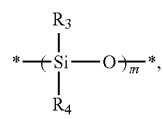

Formula 3 in which m is an integer selected from 46 to 150; $R_3$ is a hydroxy group, a substituted or unsubstituted aryl group having 6 to 30 carbon atoms for forming a ring, an alkoxy group, a substituted or unsubstituted alkyl group having 1 to 20 carbon atoms, or a photoinitiated reactive group; at least one of the plurality of $R_3$(s) is a photoinitiated reactive group; and $R_4$ is a hydroxy group, a substituted or unsubstituted aryl group having 6 to 30 carbon atoms for forming a ring, an alkoxy group, a substituted or unsubstituted alkyl group having 1 to 20 carbon atoms, or a photoinitiated reactive group; and Z is a cross-linker,
wherein X and Y are formed from substantially the same monomers.

2. The flexible display device of claim 1, wherein the photoinitiated reactive group is an ester group substituted with a substituent comprising an epoxy group or an alkenyl group, an alkyl group having 1 to 20 carbon atoms and substituted with a substituent comprising an epoxy group or an alkenyl group, or a substituted or unsubstituted alkenyl group having 1 to 20 carbon atoms.

3. The flexible display device of claim 1, wherein the photoinitiated reactive group is represented by Formula 4 or Formula 5,

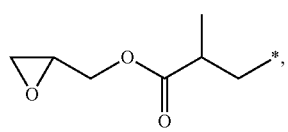

Formula 4

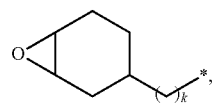

Formula 5 in which k is an integer selected from 1 to 10.

4. The flexible display device of claim 1, wherein the cross-linker comprises alicyclic diepoxy carboxylate.

5. The flexible display device of claim 1, wherein the cross-linker is one of 4-vinylcyclohexene dioxide, cyclohexene vinyl monoxide, (3,4-epoxycyclohexyl)methyl 3,4-epoxycyclohexylcarboxylate, 3,4-epoxycyclohexylmethyl methacrylate, bis(3,4-epoxycyclohexylmethyl)adipate, 3,4-epoxycyclohexanecarboxylate, or 2-(3,4-epoxycyclohexyl)-1,3-dioxolane.

6. The flexible display device of claim 1, wherein Z is represented by Formula 6:

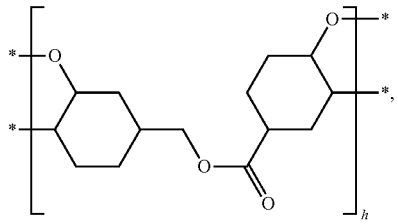

Formula 6 in which h is an integer selected from 1 to 7.

7. The flexible display device of claim 1, wherein the photoinitiator comprises a first photoinitiator and a second photoinitiator that are initiated by light of different wavelengths from each other.

8. The flexible display device of claim 1, wherein the hard coating layer further comprises at least one of a polymer represented by Formula 1A or a polymer represented by Formula 1B:

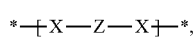

Formula 1A

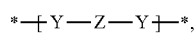

Formula 1B wherein in Formulae 1A and 1B, X, Y, and Z may each independently be the same as defined herein in connection with Formula 1.

9. A method for preparing a window member, the method comprising:
preparing a hard coating composition comprising a solvent and a hard coating solid matter that contains photoinitiators, first oligomers, second oligomers, and cross-linkers;
applying the hard coating composition on a flexible base member to form a preliminary hard coating layer;
drying the preliminary hard coating layer to remove the solvent; and
photo-curing the dried preliminary hard coating layer, wherein the molecular weight of the first oligomers is about 2,000 to 6,000 and the molecular weight of the second oligomers is about 10,000 to 30,000,
wherein:
each of the first oligomers is represented by Formula 2:

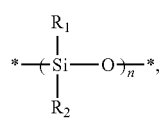

Formula 2 in which n is an integer selected from 8 to 30; $R_1$ is a hydroxy group, a substituted or unsubstituted aryl group having 6 to 30 carbon atoms for forming a ring, an alkoxy group, a substituted or unsubstituted alkyl group having 1 to 20 carbon atoms, or a photoinitiated reactive group; at least one of the plurality of $R_1(s)$ is a photoinitiated reactive group; and $R_2$ is a hydroxy group, a substituted or unsubstituted aryl group having 6 to 30 carbon atoms for forming a ring, an alkoxy group, a substituted or unsubstituted alkyl group having 1 to 20 carbon atoms, or a photoinitiated reactive group; and each of the second oligomers is represented by Formula 3,

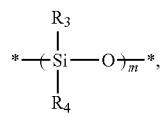

Formula 3 in which m is an integer selected from 46 to 150; $R_3$ is a hydroxy group, a substituted or unsubstituted aryl group having 6 to 30 carbon atoms for forming a ring, an alkoxy group, a substituted or unsubstituted alkyl group having 1 to 20 carbon atoms, or a photoinitiated reactive group, at least one of the plurality of $R_3(s)$ is a photoinitiated reactive group; and $R_4$ is a hydroxy group, a substituted or unsubstituted aryl group having 6 to 30 carbon atoms for forming a ring, an alkoxy group, a substituted or unsubstituted alkyl group having 1 to 20 carbon atoms, or a photoinitiated reactive group, and wherein the first and second oligomers are formed from substantially the same monomers.

10. The method of claim 9, wherein the hard coating solid matter comprises 6 wt % to 36 wt % of the first oligomers, 36 wt % to 70 wt % of the second oligomers, 10 wt % to 20 wt % of the cross-linkers, and 1 wt % to 4 wt % of the photoinitiators with respect to 100 wt % of the hard coating solid matter.

11. The method of claim 9, wherein the photoinitiated reactive group is represented by Formula 4 or Formula 5:

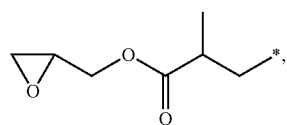

Formula 4

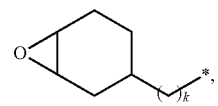

Formula 5 in which k is an integer selected from 1 to 10.

12. The method of claim 9, wherein each of the cross-linkers comprises a monomer represented by Formula 6B:

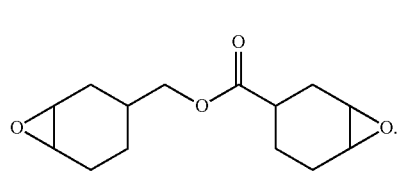

Formula 6B

13. The method of claim 9, wherein the hard coating composition further comprises silicon nanoparticles.

14. The method of claim 13, wherein the hard coating composition further comprises bisphenol-A-epoxy-silicone block copolymers.

15. The method of claim 9, wherein the photoinitiators comprise a first photoinitiator and a second photoinitiator, which are initiated by light having different wavelength ranges from each other.

16. The method of claim 15, wherein the photo-curing the dried preliminary hard coating layer comprises:
emitting light having a first wavelength range on the dried preliminary hard coating layer, the light having the first wavelength range initiating the first photoinitiator; and
emitting light having a second wavelength range on the dried preliminary hard coating layer, the light having the second wavelength range initiating the second photoinitiator.

17. A hard coating composition comprising:
a solvent; and
a hard coating solid matter, the hard coating solid matter containing 6 wt % to 36 wt % of first oligomers, 36 wt % to 70 wt % of second oligomers, 10 wt % to 20 wt % of cross-linkers, and 1 wt % to 4 wt % of photoinitiators with respect to 100 wt % of the hard coating solid matter, wherein the molecular weight of the first oligomers is about 2,000 to 6,000 and the molecular weight of the second oligomers is about 10,000 to about 30,000,
wherein:
each of the first oligomers is represented by Formula 2,

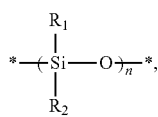

Formula 2 in which n is an integer selected from 8 to 30; $R_1$ is a hydroxy group, a substituted or unsubstituted aryl group having 6 to 30 carbon atoms for forming a ring, an alkoxy group, a substituted or unsubstituted alkyl group having 1 to 20 carbon atoms, or a photoinitiated reactive group; at least one of the plurality of $R_1$(s) is a photoinitiated reactive group; and $R_2$ is a hydroxy group, a substituted or unsubstituted aryl group having 6 to 30 carbon atoms for forming a ring, an alkoxy group, a substituted or unsubstituted alkyl group having 1 to 20 carbon atoms, or a photoinitiated reactive group; and
each of the second oligomers is represented by Formula 3,

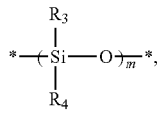

Formula 3 in which m is an integer selected from 46 to 150; $R_3$ is a hydroxy group, a substituted or unsubstituted aryl group having 6 to 30 carbon atoms for forming a ring, an alkoxy group, a substituted or unsubstituted alkyl group having 1 to 20 carbon atoms, or a photoinitiated reactive group; at least one of the plurality of $R_3$(s) is a photoinitiated reactive group; and $R_4$ is a hydroxy group, a substituted or unsubstituted aryl group having 6 to 30 carbon atoms for forming a ring, an alkoxy group, a substituted or unsubstituted alkyl group having 1 to 20 carbon atoms, or a photoinitiated reactive group.

18. The hard coating composition of claim 17, wherein the photoinitiated reactive group is represented by Formula 4 or Formula 5:

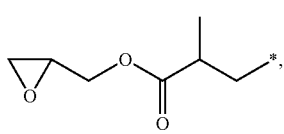

Formula 4

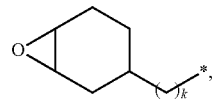

Formula 5 in which k is an integer selected from 1 to 10.

19. The hard coating composition of claim 17, wherein each of the cross-linkers comprises a monomer represented by Formula 6B:

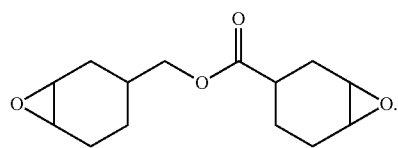

Formula 6B

20. The hard coating composition of claim 17, wherein the cross-linkers are 4-vinylcyclohexene dioxide, cyclohexene vinyl monoxide, (3,4-epoxycyclohexyl)methyl 3,4-epoxycyclohexylcarboxylate, 3,4-epoxycyclohexylmethyl methacrylate, bis(3,4-epoxycyclohexylmethyl)adipate, 3,4-epoxycyclohexanecarboxylate, or 2-(3,4-epoxycyclohexyl)-1,3-dioxolane.

21. The hard coating composition of claim 17, further comprising silicon nanoparticles.

22. The hard coating composition of claim 17, wherein the photoinitiator comprises a first photoinitiator and a second photoinitiator, which are initiated by light of different wavelength ranges from each other.

23. The hard coating composition of claim 21, further comprising a bisphenol-A-epoxy-silicone block copolymer.

* * * * *